US012039925B2

(12) United States Patent
Kim et al.

(10) Patent No.: US 12,039,925 B2
(45) Date of Patent: Jul. 16, 2024

(54) DISPLAY PANEL HAVING DIVISION AREAS AND FABRICATING METHOD OF THE SAME

(71) Applicant: Samsung Display Co., Ltd., Yongin-si (KR)

(72) Inventors: Jang-Il Kim, Anyang-si (KR); Jeongki Kim, Hwaseong-si (KR); Kyounghae Min, Anyang-si (KR); Jeaheon Ahn, Hwaseong-si (KR); Yeogeon Yoon, Suwon-si (KR); Seok-Joon Hong, Seongnam-si (KR); Tae Hyung Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/916,016

(22) PCT Filed: Jul. 15, 2020

(86) PCT No.: PCT/KR2020/008733
§ 371 (c)(1),
(2) Date: Sep. 29, 2022

(87) PCT Pub. No.: WO2021/201340
PCT Pub. Date: Oct. 7, 2021

(65) Prior Publication Data
US 2023/0169914 A1 Jun. 1, 2023

(30) Foreign Application Priority Data
Mar. 31, 2020 (KR) .................. 10-2020-0039157

(51) Int. Cl.
*G09G 3/3208* (2016.01)
*G02F 1/1335* (2006.01)
*G09G 3/36* (2006.01)

(52) U.S. Cl.
CPC ..... *G09G 3/3208* (2013.01); *G02F 1/133514* (2013.01); *G09G 3/3607* (2013.01); *G09G 2320/0666* (2013.01)

(58) Field of Classification Search
CPC ............... G09G 3/3208; G09G 3/3607; G09G 2320/0666; G02F 1/133514
See application file for complete search history.

(56) References Cited

U.S. PATENT DOCUMENTS 10,228,586 B2   3/2019   Chae et al.
10,692,939 B2   6/2020   Yang
(Continued)

FOREIGN PATENT DOCUMENTS

JP      2011-030181 A    2/2011
KR  10-2015-0136938 A   12/2015
(Continued)

OTHER PUBLICATIONS

International Search Report for corresponding Application No. PCT/KR2020/008733 dated Dec. 17, 2020, 4pp.

*Primary Examiner* — Afroza Chowdhury
(74) *Attorney, Agent, or Firm* — Lewis Roca Rothgerber Christie LLP

(57) ABSTRACT

A display substrate includes a first division pattern in which a plurality of first openings corresponding to the first pixel areas and the second pixel areas are defined, a first color filter overlapping each of the first pixel area of the first pixel row and the first pixel area of the second pixel row, a second division pattern which overlaps the peripheral area and in which a first common opening corresponding to each of the first pixel area of the first pixel row and the first pixel area of the second pixel row, which are in one pixel row, is defined, and a first color control pattern corresponding to the first common opening and overlapping each of the first pixel (Continued)

area of the first pixel row and the first pixel area of the second pixel row, which are in the one pixel row.

33 Claims, 30 Drawing Sheets

(56) References Cited

U.S. PATENT DOCUMENTS

| | | |
|---|---|---|
| 11,282,820 B2 | 3/2022 | Takeya et al. |
| 2017/0338292 A1 | 11/2017 | Choi et al. |
| 2021/0222065 A1* | 7/2021 | You .................. G03F 7/0955 |

FOREIGN PATENT DOCUMENTS

| | | |
|---|---|---|
| KR | 10-2016-0080077 A | 7/2016 |
| KR | 10-2016-0090176 A | 7/2016 |
| KR | 10-1751600 B1 | 6/2017 |
| KR | 10-2017-0130019 A | 11/2017 |
| KR | 10-2018-0035286 A | 4/2018 |
| KR | 10-2019-0026617 A | 3/2019 |
| KR | 10-2019-0072822 A | 6/2019 |

\* cited by examiner

DISPLAY PANEL HAVING DIVISION AREAS AND FABRICATING METHOD OF THE SAME

CROSS-REFERENCE TO RELATED APPLICATIONS

This application is a U.S. National Phase patent application of International Application Number PCT/KR2020/008733, filed Jul. 15, 2020, which claims priority to Korean Patent Application No. 10-2020-0039157, filed on Mar. 31, 2020, the entire contents of each of which are hereby incorporated by reference.

FIELD

Aspects of some embodiments of the present disclosure relate to a display panel, and for example, to a high-resolution display panel and a method for fabricating the same.

BACKGROUND

A display panel includes a transmissive display panel selectively transmitting source light generated from a light source and an emission type display panel generating source light in the display panel itself. The display panel may include different kinds of color control patterns according to pixels to generate a color image. The color control patterns may transmit only source light in a partial wavelength length or convert a color of the source light. A portion of the color control pattern may not convert the color of the source light but convert properties of the light.

The above information disclosed in this Background section is only for enhancement of understanding of the background and therefore the information discussed in this Background section does not necessarily constitute prior art.

SUMMARY

An object of the present invention is to provide a high-resolution display panel having a reduced defect rate.

An object of the present invention is to provide a display panel having reduced image spots.

An object of the present invention is to provide a method for fabricating a display panel including a color control pattern formed using a liquid composition.

A display device according to some embodiments of the present invention includes a lower display substrate including light emitting elements configured to generate source light and an upper display substrate facing the lower display substrate. The upper display substrate includes first and second pixel rows, each of which include first and second pixel areas, which are alternately arranged along a first direction, and a peripheral area adjacent to the first pixel areas and the second pixel areas. The first pixel row and the second pixel row are arranged along a second direction crossing the first direction.

The upper display substrate includes: a first division pattern in which a plurality of first openings corresponding to the first pixel areas and the second pixel areas are defined, a first color filter overlapping each of the first pixel area of the first pixel row and the first pixel area of the second pixel row, which are aligned in the second direction, among the first pixel areas of the first pixel row and the second pixel row, a second division pattern which overlaps the peripheral area and in which a first common opening corresponding to the first pixel area of the first pixel row and the first pixel area of the second pixel row, which are aligned in the second direction, is defined, and a first color control pattern corresponding to the first common opening.

On a plane (or in a plan view), a portion of the first division pattern may be between the first pixel area of the first pixel row and the first pixel area of the second pixel row, which are aligned in the second direction, and the first color control pattern may overlap the portion of the first division pattern.

On a plane (or in a plan view), the first pixel area of the first pixel row and the first pixel area of the second pixel row may be located inside the first common opening.

A second common opening corresponding to the second pixel area of the first pixel row and the second pixel area of the second pixel row, which are aligned in the second direction, among the second pixel areas of the first pixel row and the second pixel row may be further defined in the second division pattern. The upper display substrate may further include a second color control pattern arranged to correspond to the second common opening and overlapping each of the second pixel area of the first pixel row and the second pixel area of the second pixel row, which are aligned in the second direction.

The first color control pattern and the second color control pattern may include quantum dots different from each other.

The display panel may further include a second color filter overlapping each of the second pixel area of the first pixel row and the second pixel area of the second pixel row, which are aligned in the second direction.

A portion of each of the first color filter and the second color filter may overlap the peripheral area.

The upper display substrate may further include a third pixel row and a fourth pixel row, which include third pixel areas arranged along the first direction, wherein the third pixel row and the fourth pixel row may be spaced apart from each other in the second direction. The first pixel row and the second pixel row may be arranged between the third pixel row and the fourth pixel row in the second direction.

A second opening corresponding to each of the third pixel areas may be defined by combining a portion of the first color filter and a portion of the second color filter.

The first pixel areas may be configured to provide red light, the second pixel areas may be configured to provide green light, and the third pixel areas may be configured to provide blue light, and the first color filter may occupy a surface area greater than that of the second color filter on a peripheral area of the second opening.

Combination of the second pixel row and the fourth pixel row may be defined as a unit pixel row, wherein the unit pixel row may include a plurality of unit areas arranged along the first direction. Each of the plurality of unit areas may include one first pixel area and one second pixel area, which are adjacent to each other, among the first pixel areas and the second pixel areas of the second pixel row, and one third pixel area among the third pixel areas of the fourth pixel row. The one third pixel area may be between the one first pixel area and the one second pixel area in the first direction.

The first division pattern may include a third color filter having a color that is different from that of each of the first color filter and the second color filter, wherein the third color filter may overlap the third pixel areas.

In a partial area of the peripheral area adjacent to the first pixel areas, the third color filter and the first color filter may overlap each other.

In the partial area of the peripheral area adjacent to the first pixel areas, the second color filter may overlap the first color filter and the third color filter.

Second openings corresponding to the second pixel areas may be defined in the first color filter.

According to some embodiments, a display device includes a display panel including first and second pixel rows, each of which include first and second pixel areas, which are alternately arranged along a first direction, and a peripheral area adjacent to the first pixel areas and the second pixel areas, wherein the first pixel row and the second pixel row are arranged along a second direction crossing the first direction. The display panel includes light emitting elements overlapping the first pixel areas and the second pixel areas and configured to generate source light, a first color filter overlapping the first pixel area of the first pixel row and the first pixel area of the second pixel row, which are aligned in the second direction, among the first pixel areas, a second color filter overlapping the second pixel area of the first pixel row and the second pixel area of the second pixel row, which are aligned in the second direction, among the second pixel areas, a third color filter, in which a plurality of first opening corresponding to the first pixel areas and the second pixel areas are defined, a partition wall which overlaps the peripheral area and in which a first common opening corresponding to the first pixel area of the first pixel row and the first pixel area of the second pixel row, which are aligned in the second direction, is defined, and a first quantum dot layer corresponding to the first common opening and overlapping the first pixel area of the first pixel row and the first pixel area of the second pixel row, which are aligned in the second direction.

A second common opening corresponding to the second pixel area of the first pixel row and the second pixel area of the second pixel row, which are aligned in the second direction, may be further defined in the partition wall. The display panel may further include a second quantum dot layer corresponding to the second common opening and overlapping the second pixel area of the first pixel row and the second pixel area of the second pixel row, which are aligned in the second direction.

A plurality of second openings corresponding to the second pixel areas of the first pixel row and the second pixel areas of the second pixel row may be defined in the first color filter, and a plurality of third openings corresponding to the first pixel areas of the first pixel row and the second pixel row may be defined in the second color filter.

In the first pixel area of the first pixel row and the first pixel area of the second pixel row, which are aligned in the second direction, the first color filter may overlap the first quantum dot layer, and in the peripheral area, the third color filter may overlap the first color filter.

According to some embodiments, a method for fabricating a display substrate includes providing a preliminary display substrate including first and second pixel rows, each of which includes first pixel areas and second pixel areas, which are alternately arranged along a first direction, and a peripheral area adjacent to the first pixel areas and the second pixel areas, wherein the first pixel row and the second pixel row are arranged along a second direction crossing the first direction, forming a partition wall, in which a common opening corresponding to the first pixel area of the first pixel row and the first pixel area of the second pixel row, which are arranged along one pixel row on the preliminary display substrate is defined, providing a quantum dot solution into the common opening, and curing the quantum dot solution.

According to some embodiments, a display panel includes a lower display substrate including light emitting elements configured to generate source light, and an upper display substrate including a first unit pixel row and a second unit pixel row, each of which include a plurality of unit areas arranged along a first direction and are arranged along a second direction crossing the first direction. Each of the plurality of unit areas may include a first pixel area, a second pixel area, a third pixel area, and a peripheral area adjacent to the first pixel area, the second pixel area, and the third pixel area. The upper display substrate may include a first division pattern in which a plurality of first openings corresponding to the first pixel area and the second pixel area of the first unit pixel row and the second unit pixel row are defined, a first color filter overlapping each of the first pixel area of the first unit pixel row and the first pixel area of the second unit pixel row, which are aligned in the second direction, a second division pattern which overlaps the peripheral area and in which a first common opening corresponding to the first pixel area of the first unit pixel row and the first pixel area of the second unit pixel row, which are aligned in the second direction, is defined, and a first color control pattern arranged to correspond to the first common opening.

The first pixel area, the second pixel area, and the third pixel area of each of the plurality of unit areas of the first unit pixel row may have a first arrangement, and the first pixel area, the second pixel area, and the third pixel area of each of the plurality of unit areas of the second unit pixel row may have a second arrangement different from the first arrangement.

The plurality of unit areas may include a first unit area having a first arrangement of the first pixel area, the second pixel area, and the third pixel area and a second unit area having a second arrangement, which is different from the first arrangement, of the first pixel area, the second pixel area, and the third pixel area, and wherein the first unit area of the first unit pixel row and the second unit area of the second unit pixel row may be aligned in the second direction.

A second common opening corresponding to the second pixel area of the first unit area of the first unit pixel row and the second pixel area of the second unit area of the second unit pixel row, which are aligned in the second direction, may be defined in the second division pattern, and the upper display substrate may further include a second color filter, which overlaps each of the second pixel area of the first unit area of the first unit pixel row and the second pixel area of the second unit area of the second unit pixel row, which are aligned in the second direction, and a second color control pattern arranged to correspond to the second common opening.

The source light may be blue light, the first color control pattern may convert the blue light into red light, and the second color control pattern may convert the blue light into green light.

The first color filter and the second color filter may be arranged along the first direction.

The second unit area of the first unit pixel row and the first unit area of the second unit pixel row may be aligned in the second direction, and the upper display substrate may further include a third color filter overlapping each of the third pixel area of the second unit area of the first unit pixel row and the third pixel area of the first unit area of the second unit pixel row, which are aligned in the second direction.

A third common opening corresponding to the third pixel area of the second unit area of the first unit pixel row and the third pixel area of the first unit area of the second unit pixel row, which are aligned in the second direction may be defined in the second division pattern, the upper display substrate may further include a third color control pattern corresponding to the third common opening, and the source light may be blue light, and the third color control pattern may scatter the incident blue light.

According to some embodiments, a display panel includes a lower display substrate including light emitting elements configured to generate source light, and an upper display substrate including a first unit pixel row and a second unit pixel row, each of which include a plurality of unit areas arranged along a first direction and are arranged along a second direction crossing the first direction. Each of the plurality of unit areas may include a first pixel area, a second pixel area, a third pixel area, and a peripheral area adjacent to the first pixel area, the second pixel area, and the third pixel area. The plurality of unit areas may include a first unit area having a first arrangement of the first pixel area, the second pixel area, and the third pixel area and a second unit area having a second arrangement, which is different from the first arrangement, of the first pixel area, the second pixel area, and the third pixel area. The upper display substrate may include a first division pattern in which a plurality of first openings corresponding to the first pixel area and the second pixel area of the first unit pixel row and the second unit pixel row are defined, a first color filter overlapping each of the first pixel area of the first unit area row and the first pixel area of the second unit area of the first unit pixel row, which are aligned in the first direction, a second division pattern which overlaps the peripheral area and in which a first common opening corresponding to the first pixel area of the first unit area and the first pixel area of the second unit area of the first unit pixel row, which are aligned in the first direction, is defined, and a first color control pattern corresponding to the first common opening.

The first unit area of the first unit pixel row and the first unit area of the second unit pixel row may be aligned in the second direction, and the second unit area of the first unit pixel row and the second unit area of the second unit pixel row may be aligned in the second direction.

The first unit area of the first unit pixel row and the second unit area of the second unit pixel row may be aligned in the second direction, and the second unit area of the first unit pixel row and the first unit area of the second unit pixel row may be aligned in the second direction.

The upper display substrate may further include a second color filter overlapping each of the second pixel area of the first unit area and the second pixel area of the second unit area of the second unit pixel row, which are adjacent to each other in the first direction, and a second color control pattern overlapping the second color filter. A second common opening corresponding to the second pixel area of the first unit area and the second pixel area of the second unit area of the second unit pixel row accommodating the second color control pattern may be defined in the second division pattern.

The upper display substrate may further include a third color filter overlapping each of the third pixel area of the first unit area and the third pixel area of the second unit area of the first unit pixel row, which are adjacent to each other in the first direction, and a third color control pattern overlapping the third color filter. A third common opening corresponding to the third pixel area of the first unit area and the third pixel area of the second unit area of the first unit pixel row, which are adjacent to each other in the first direction, and configured to accommodate the third color control pattern may be defined in the second division pattern.

As described above, the color control pattern of the display panel may be formed using the liquid composition. The deference in surface area between the two pixel areas and the first common opening may be minimized. Therefore, the reflectance of the external light may be reduced.

The first common opening may be divided into the two areas by the color filter. The two areas may correspond to the two pixel areas different from each other. The one color filter or the color filter laminated structure may have the function of the division pattern and prevent the crosstalk between the two different pixels from occurring.

The first and second unit areas on which the arrangements of the first to third pixel areas are different may be provided to reduce the image spots.

Since the one first common opening overlaps the two pixel areas, which are respectively provided in the two pixel rows, the sufficient space for forming the color control pattern may be provided. Therefore, the process conditions of the liquid phase process may be satisfied. The first common opening may be simplified in shape to reduce the process error.

BRIEF DESCRIPTION OF THE DRAWINGS

FIG. 3b is a cross-sectional view taken along the line I-I' of FIG. 3a.

FIG. 4b is a cross-sectional view taken along the line II-II' of FIG. 4a.

MODE FOR CARRYING OUT THE INVENTION

Figure 1A:
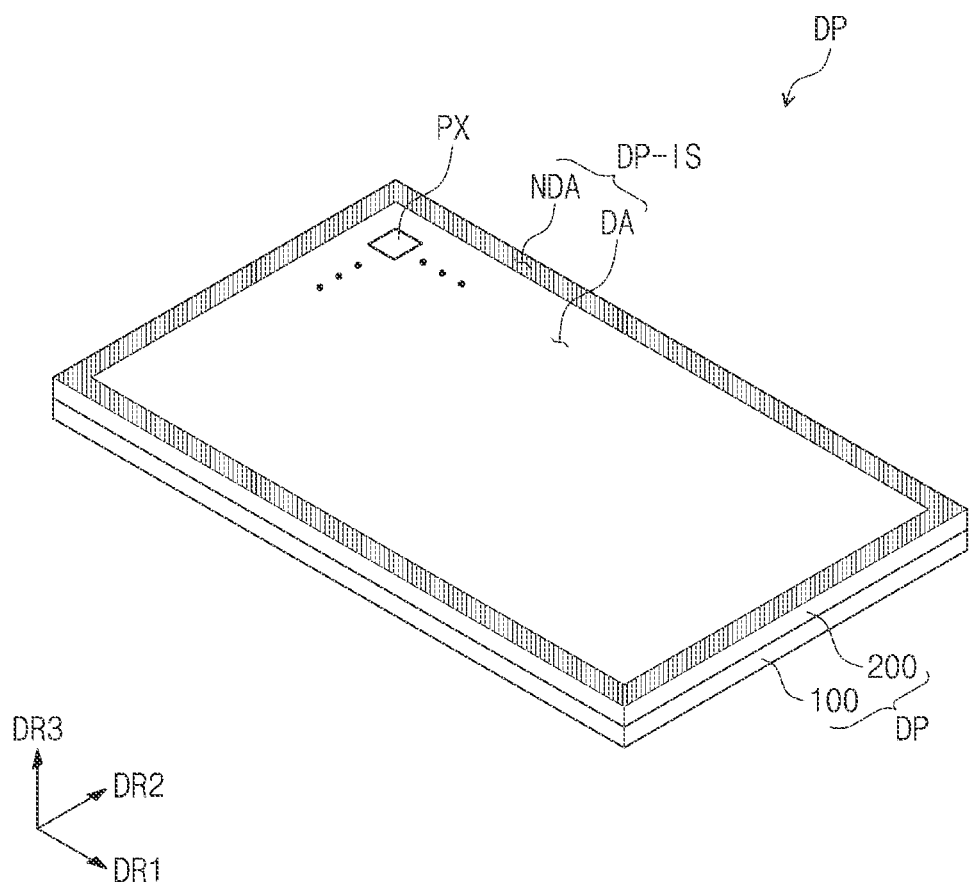
FIG. 1a is a perspective view of a display panel according to some embodiments of the present invention.

In this specification, it will also be understood that when one component (or region, layer, portion) is referred to as being "on", "connected to", or "coupled to" another component, it can be directly arranged on/connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated elements.

It will be understood that although the terms such as 'first' and 'second' are used herein to describe various elements, these elements should not be limited by these terms. The terms are only used to distinguish one component from other components. For example, a first element referred to as a first element in some embodiments can be referred to as a second element in other embodiments without departing from the scope of the appended claims. The terms of a singular form may include plural forms unless referred to the contrary.

Also, "under", "below", "above", "upper", and the like are used for explaining relation association of the elements illustrated in the drawings. The terms may be a relative concept and described based on directions expressed in the drawings.

The meaning of "include" or "comprise" specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as commonly understood by a person of ordinary skill in the art to which the present invention belongs. Also, terms such as defined terms in commonly used dictionaries are to be interpreted as having meanings consistent with meaning in the context of the relevant art and are expressly defined herein unless interpreted in an ideal or overly formal sense.

Hereinafter, embodiments of the present invention will be described with reference to the accompanying drawings.

Figure 1B:
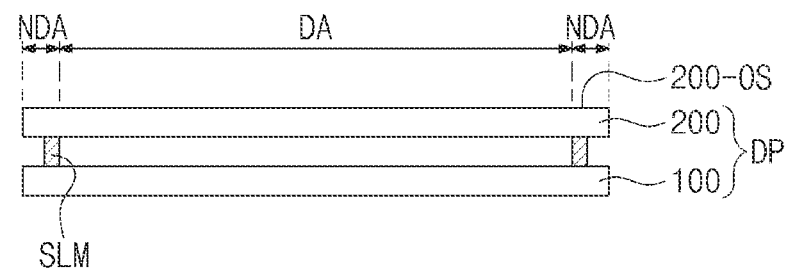
FIG. 1b is a cross-sectional view of the display panel according to some embodiments of the present invention.
Figure 2:
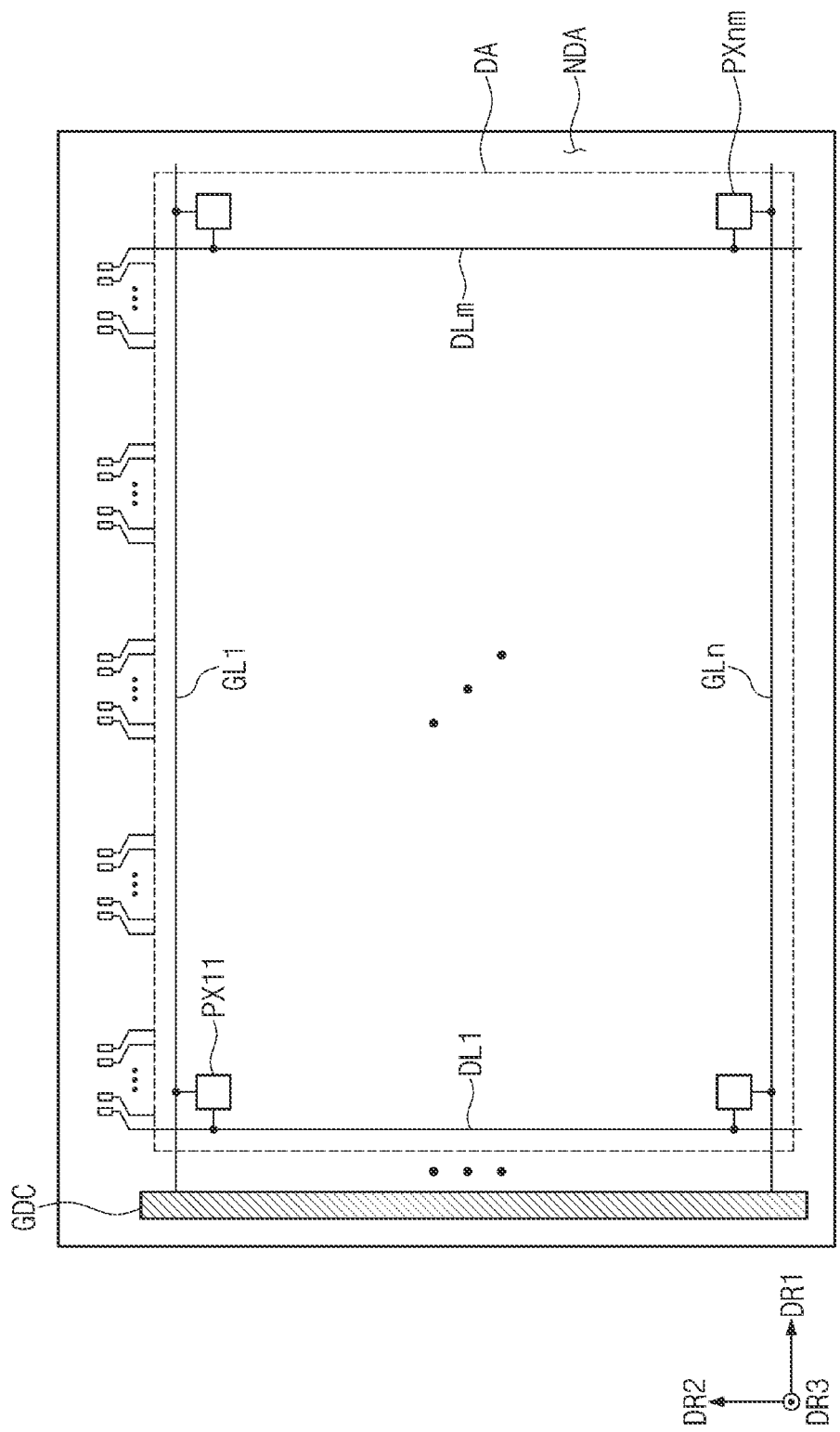
FIG. 2 is a plan view of the display panel according to some embodiments of the present invention.

FIG. 1a is a perspective view of a display panel DP according to some embodiments of the present invention. FIG. 1b is a cross-sectional view of the display panel DP, according to some embodiments of the present invention. FIG. 2 is a plan view of the display panel DP according to some embodiments of the present invention.

Figure 1B:
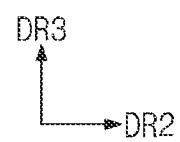

Referring to FIGS. 1a to 2, the display panel DP may be one of a liquid crystal display panel, an electrophoretic display panel, a microelectromechanical system (MEMS) display panel, an electrowetting display panel, and an organic light emitting display panel, but is not specifically limited thereto.

Although not separately shown, the display panel DP may further include a chassis member or a molding member and also may further include a backlight unit according to a kind of display panel DP.

The display panel DP may include a first display substrate 100 (or a lower display substrate) and a second display substrate 200 (or an upper display substrate) spaced apart from the first display substrate 100 to face the first display substrate 100. A predetermined cell gap may be defined between the first display substrate 100 and the second display substrate 200. The cell gap may be maintained by a sealant SLM through which the first display substrate 100 and the second display substrate 200 are coupled to each other.

A gradation display layer for generating an image may be located between a base substrate of the first display substrate 100 and a base substrate of the second display substrate 200. The gradation display layer may include a liquid crystal layer, an organic light emitting layer, and an electrophoretic layer according to the kind of display panel.

As illustrated in FIG. 1a, the display panel DP may display an image through a display surface DP-IS. An outer surface 200-OS of the second display substrate 200 illustrated in FIG. 1b may be defined as the display surface DP-IS of FIG. 1a.

The display surface DP-IS is parallel to a surface defined by a first directional axis DR1 and a second directional axis DR2. The display surface DP-IS may include a display area DA and a non-display area NDA. A pixel PX is located on the display area DA and is not located on the non-display area NDA. The non-display area NDA is defined along an edge of the display surface DP-IS. The non-display area NDA may surround the display area DA. According to some embodiments of the present invention, the non-display area NDA may be omitted or may be located at only one side of the display area DA.

A normal direction of the display surface DP-IS, i.e., a thickness direction of the display panel DP is indicated as a third directional axis DR3. A front surface (or a top surface) and a rear surface (or a bottom surface) of each of layers or units, which will be described below, are distinguished by the third directional axis DR3. However, the first to third directional axes as illustrated may be merely examples. Hereinafter, first to third directions may be directions indicated by the first to third directional axes DR1, DR2, and DR3 and designated by the same reference numerals, respectively.

Although the display panel DP having a planar display surface DP-IS is illustrated according to some embodiments of the present invention, the embodiments of the present invention are not limited thereto. The display panel DP may include a curved display surface or a solid display surface. The solid display surface may include a plurality of display areas that indicate different directions.

FIG. 2 illustrates an arrangement relationship between signal lines GL1 to GLn and DL1 to DLm and pixels PX11 to PXnm on a plane. The signal lines GL1 to GLn and DL1 to DLm may include a plurality of gate lines GL1 to GLn, and a plurality of data lines DL1 to DLm.

Each of the pixels PX11 to PXnm are connected to the corresponding gate lines of the plurality of gate lines GL1 to GLn and the corresponding data lines of the plurality of data lines DL1 to DLm, respectively. Each of the pixels PX11 to PXnm may include a pixel driving circuit and a display element. More kinds of signal lines may be provided on the display panel DP according to a configuration of the pixel driving circuit of the pixels PX11 to PXnm.

Figure 3A:
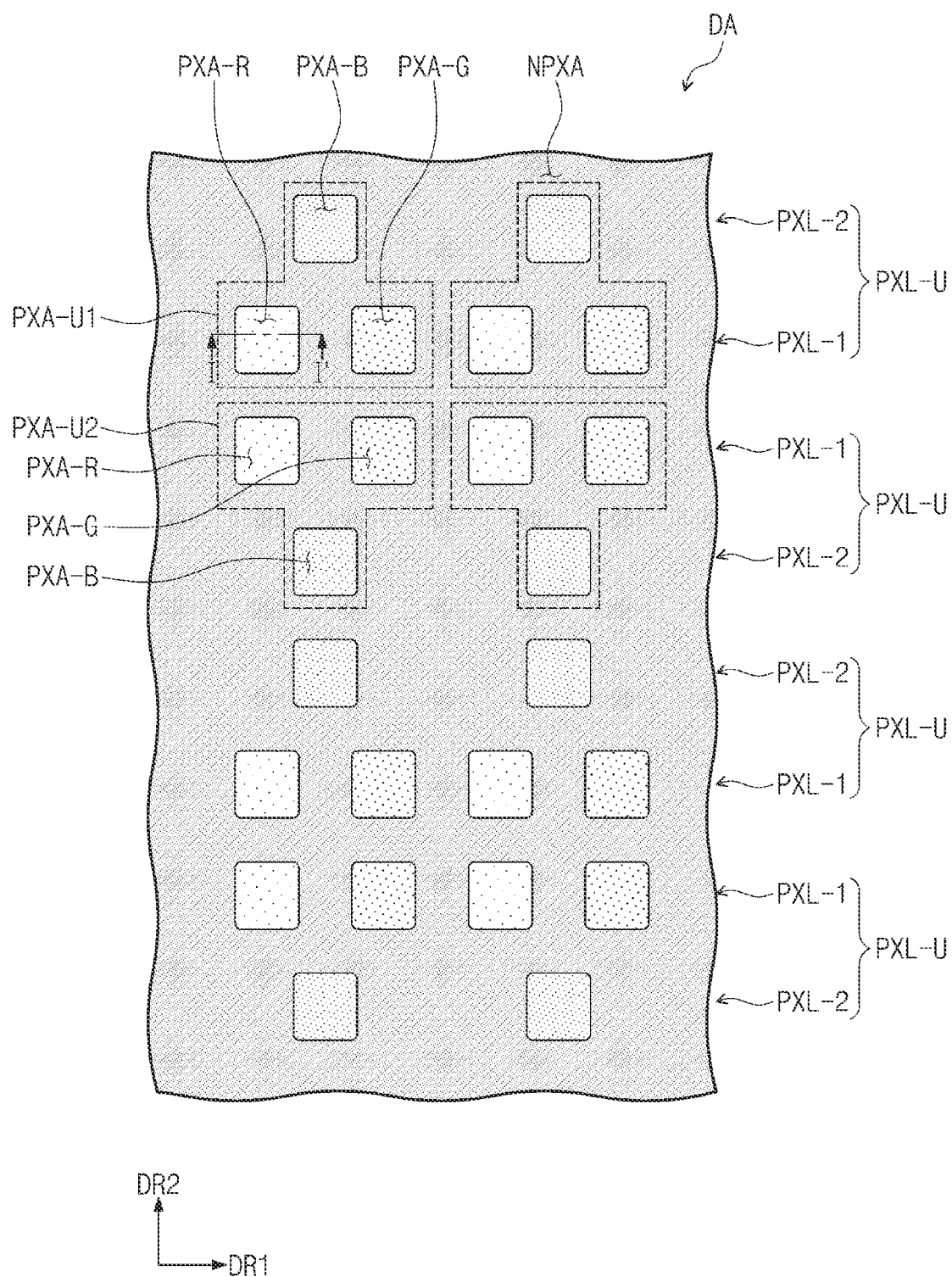
FIG. 3a is a plan view illustrating a display area of the display panel according to some embodiments of the present invention.
Figure 3B:
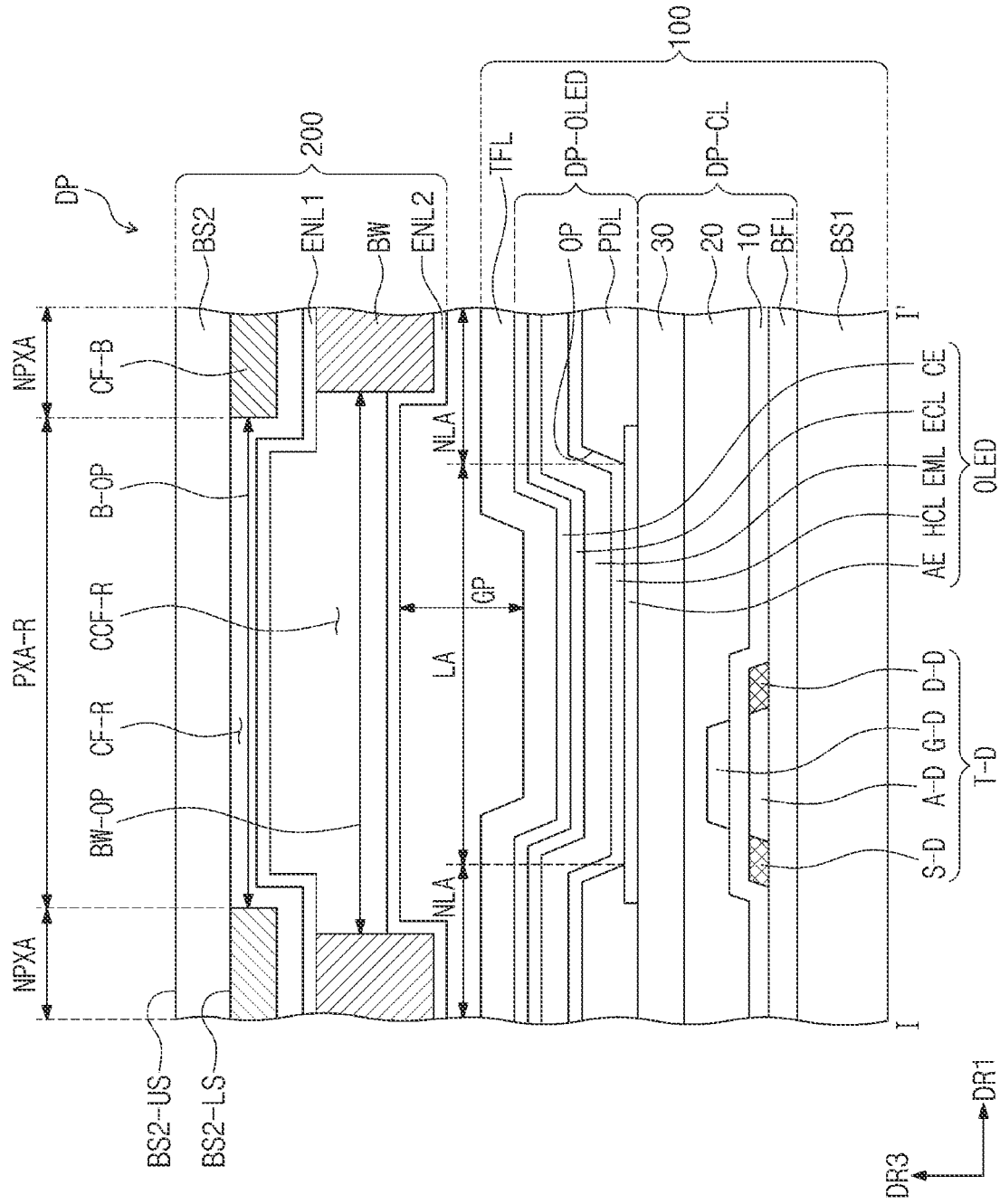

FIG. 3a is a cross-sectional view illustrating a display area DA of the display panel DP according to some embodiments of the present invention. FIG. 3b is a cross-sectional view taken along the line I-I' of FIG. 3a.

A plurality of pixel areas PXA-R, PXA-G, and PXA-B illustrated in FIG. 3a are illustrated in a shape that is viewed from the outer surface 200-OS of the second display substrate 200 illustrated in FIG. 1b. A peripheral area NPXA is located adjacent to the plurality of pixel areas PXA-R, PXA-G, and PXA-B. The peripheral area NPXA sets a boundary between the first to third pixel areas PXA-R, PXA-G, and PXA-B to prevent colors from being mixed with each other between the first to third pixel areas PXA-R, PXA-G, and PXA-B. The plurality of pixel areas PXA-R, PXA-G, and PXA-B may be provided in a plurality of pixel rows PXL-1 and PXL-2 extending in the first direction DR1.

According to some embodiments, the plurality of pixel areas PXA-R, PXA-G, and PXA-B may be divided into three groups. The first to third pixel areas PXA-R, PXA-G, and PXA-B may provide light having different colors onto the outer surface 200-OS of the second display substrate 200. The first pixel areas PXA-R may provide red light, the second pixel areas PXA-G may provide green light, and the third pixel areas PXA-B may provide blue light onto the outer surface 200-OS of the second display substrate 200.

According to some embodiments, the plurality of pixel rows PXL-1 and PXL-2 may be divided into two groups. Each of the pixel rows PXL-1 of the first group includes the first pixel areas PXA-R and the second pixel areas PXA-G, which are alternately arranged along the first direction DR1. The pixel rows PXL-1 of the first group have the same arrangement of the pixel areas.

Each of the pixel rows PXL-2 of the second group includes the third pixel areas PXA-B arranged along the first direction DR1. The pixel rows PXL-2 of the second group have the same arrangement of the pixel areas.

In the second direction DR2, the pixel rows PXL-1 of two first groups are sequentially arranged. In addition, the pixel rows PXL-2 of two second groups are sequentially arranged. The pixel rows PXL-1 of two first groups and the pixel rows PXL-2 of two second groups are alternately arranged along the second direction DR2. In the first direction DR1, the third pixel area PXA-B is located between the first pixel area PXA-R and the second pixel area PXA-G.

One first pixel area PXA-R, one second pixel area PXA-G, and one third pixel area PXA-B constitute one unit areas PXA-U1 and PXA-U2. The pixel rows PXL-1 of one first group and the pixel rows PXL-2 of one second group may define one unit pixel row PXL-U. The unit pixel rows PXL-U are arranged along the second direction DR2. In one unit pixel row PXL-U, the plurality of unit areas PXA-U1 and PXA-U2 are arranged along the first direction DR1.

According to some embodiments, the plurality of unit areas PXA-U1 and PXA-U2 may be divided into two groups. The unit area PXA-U1 of the first group (hereinafter, referred to as a first unit area) and the unit area PXA-U2 of the second group (hereinafter, referred to as a second unit area) may have different pixel arrangements. Here, the pixel arrangement refers to a shape or rule in which the first pixel area PXA-R, the second pixel area PXA-G, and the third pixel area PXA-B are arranged on the plane. In the first unit area PXA-U1, the third pixel area PXA-B is located above the first pixel areas PXA-R and the second pixel areas PXA-G in the second direction DR2, and the third pixel area PXA-B of the second unit area PXA-U2 is located below the first pixel area PXA-R and the second pixel area PXA-G in the second direction DR2.

Although the first to third pixel areas PXA-R, PXA-G, and PXA-B having the same surface areas on the plane are illustrated, the embodiments of the present invention are not limited thereto. At least two surface areas of the first to third pixel areas PXA-R, PXA-G, and PXA-B may be different from each other. Although each of the first to third pixel areas PXA-R, PXA-G, and PXA-B, each of which has a rounded square shape on the plane, is illustrated, the embodiments of the present invention are not limited thereto. Each of the first to third pixel areas PXA-R, PXA-G, and PXA-B may have a different polygonal shape such as a rhombus shape or a pentagonal shape on the plane.

Referring to FIG. 3b, a cross-section corresponding to a driving transistor T-D and a light emitting element OLED is illustrated as an example. A predetermined gap GP may be defined between the first display substrate 100 and the second display substrate 200. According to some embodiments, the gap GP is described as an empty space, but according to some embodiments of the present invention, a predetermined material may be filled into the gap GP.

FIG. 3b illustrates a cross-section corresponding to the first pixel area PXA-R. The display substrate 100 includes a first base substrate BS1, a circuit element layer DP-CL located on the first base substrate BS1, a display element layer DP-OLED located on the circuit element layer DP-CL, and an upper insulating layer TFL.

The first base substrate BS1 may include a synthetic resin substrate or a glass substrate. The circuit element layer DP-CL includes at least one insulating layer and a circuit element. The circuit element includes the signal line and the driving circuit of the pixel. The circuit element layer DP-CL may be formed through a process of forming an insulation, a semiconductor layer, and a conductive layer by coating or deposition and a process of patterning the insulation, the semiconductor layer, and the conductive layer by a photo-lithography process.

According to some embodiments, the circuit element layer DP-CL may include a buffer layer BFL, a first insulating layer 10, a second insulating layer 20, and a third insulating layer 30. For example, each of the first insulating layer 10 and the second insulating layer 20 may be an inorganic layer, and the third insulating layer 30 may be an organic layer.

FIG. 2a illustrates an example of an arrangement relationship of an active A-D, a source S-D, a drain D-D, and a gate G-D, which constitute the driving transistor T-D. The active A-D, the source S-D, and the drain D-D may be areas that are divided according to a doping concentration or conductivity of the semiconductor pattern.

The display element layer DP-OLED includes a light emitting diode OLED. The light emitting element OLED may generate source light. The light emitting element OLED includes a first electrode, a second electrode, and a light emitting layer located between the first and second electrodes. According to some embodiments, the display element layer DP-OLED may include an organic light emitting diode as the light emitting diode. The display element layer DP-OLED includes a pixel defining layer PDL. For example, the pixel defining layer PDL may be an organic layer.

A first electrode AE is located on the third insulating layer 30. The first electrode AE is directly or indirectly connected to the driving transistor T-D, and a connection structure between the first electrode AE and the driving transistor T-D is not illustrated in FIG. 3b. An emission opening OP is defined in a pixel defining layer PDL. The emission opening OP of the pixel defining layer PDL exposes at least a portion of the first electrode AE. The emission opening OP defines an emission area LA corresponding to the first pixel area PXA-R in the first display substrate 100. Here, the "corresponding" means overlapping and is not limited as the same area. The first display substrate 100 has emission areas LA and non-emission areas NLA, which correspond to the pixel areas PXA-R, PXA-G, and PXA-B and the peripheral area NPXA illustrated in FIG. 3a, respectively.

A hole control layer HCL, a light emitting layer EML, and an electron control layer ECL may be commonly located on the pixel area PXA-R and the peripheral area NPXA. The hole control layer HCL, the light emitting layer EML, and the electron control layer ECL may be commonly located on the first to third pixel areas PXA-R, PXA-G, and PXA-B (see FIG. 3a).

The hole control layer HCL may include a hole transport layer and may further include a hole injection layer. The light emitting layer EML may generate blue light. The blue light may include a wavelength of about 410 nm to about 480 nm. An emission spectrum of the blue light may have a peak within a wavelength of about 440 nm to about 460 nm.

According to some embodiments, a color of the source light may be changed. For example, the source light may be white light. The white light may be generated by mixing at least two color light. According to some embodiments of the present invention, the light emitting layer EML may include at least two light emitting layers. The first light emitting layer may generate yellow light, and the second light emitting layer may generate blue light. The laminated structure of the light emitting layer EML is not particularly limited and may have various structures referred to as a tandem structure.

The electron control layer ECL may include an electron transport layer and may further include an electron injection layer. The light emitting layer EML may be commonly located on the first to third pixel areas PXA-R, PXA-G, and PXA-B or may be independently arranged. The independent arrangement means that the light emitting layer EML is separated for each of the first to third pixel areas PXA-R, PXA-G, and PXA-B. The second electrode CE is located on the electron control layer ECL. The second electrode CE may be commonly located on the first to third pixel areas PXA-R, PXA-G, and PXA-B.

An upper insulation layer TFL protecting the second electrode CE may be located on the second electrode CE. The upper insulating layer TFL may include an organic material or an inorganic material. The upper insulating layer TFL may have a multilayered structure in which the inorganic layer/the organic layer are repeated. The upper insulating layer TFL may have a sealing structure of the inorganic layer/the organic layer/the inorganic layer. The upper insulating layer TFL may further include a refractive index control layer for improving emission efficiency.

The first display substrate 100 may include first, second, and third display elements respectively corresponding to the first to third pixel areas PXA-R, PXA-G, and PXA-B illustrated in FIG. 3a. The first, second, and third display elements may have the same laminated structure as each other and also may have the same laminated structure as the light emitting element OLED of FIG. 3b.

As illustrated in FIG. 3b, the second display substrate 200 includes a second base substrate BS2, color filters CF-R and CF-B located on a bottom surface BS2-LS of the second base substrate BS2, a partition wall BW located below the color filters, and a color control pattern CCF-R. A top surface BS2-US of the second base substrate BS2 corresponds to the outer surface 200-OS of the second display substrate 200 illustrated in FIG. 1b.

Also, the second display substrate 200 may further include at least one inorganic layer. At least one inorganic layer ENL1 and ENL2 may be further provided. The at least one inorganic layer ENL1 and ENL2 may include at least one of silicon oxide, silicon nitride, or silicon oxy nitride. According to some embodiments, the two inorganic layers ENL1 and ENL2 are illustrated, but embodiments according to the present disclosure are not limited thereto. Each of the inorganic layers ENL1 and ENL2 has a function of a sealing layer in terms of durability of the second display substrate 200 and a function of a low refractive film in terms of an emission path.

The second base substrate BS2 may include a synthetic resin substrate or a glass substrate. Each of the color filters CF-R and CF-B and the color control pattern CCF-R includes a plurality of groups corresponding to the pixel areas PXA-R, PXA-R, and PXA-B. Each of the color filters CF-R and CF-B and the color control pattern CCF-R includes three groups corresponding to the first to third pixel areas PXA-R, PXA-G, and PXA-B.

The first to third color filters CF-R, CF-G, and CF-B reduce reflectance of external light. Each of the first to third color filters transmits light having a specific wavelength range and blocks light having a corresponding wavelength range. The first to third color filters CF-R, CF-G, and CF-B include a base resin and a dye and/or pigment dispersed in the base resin. The base resin may be a medium in which the dye and/or pigment are dispersed. In general, the base resin may include various resin compositions that are called binders. According to some embodiments, the first color filter may be a red color filter, the second color filter may be a green color filter, and the third color filter may be a blue color filter.

The first to third color control patterns CCF-R, CCF-G, and CCF-B change optical properties of the source light. The first and second color control patterns may generate light having different colors after absorbing the source light generated by the light emitting element OLED. The third color control pattern may transmit and scatter a portion of the incident source light.

The first and second color control patterns may include a base resin and quantum dots mixed (or dispersed) in the base resin. According to some embodiments, the first color control pattern and the second color control pattern may be defined as a quantum dot layer and include different quantum dots. The base resin may be a medium in which the quantum dots are dispersed. In general, the base resin may include various resin compositions that are called binders. However, the embodiments of the present invention are not limited thereto. In this specification, a medium capable of dispersing the quantum dots may be called the base resin regardless of its name, additional other functions, constituent materials, and the like. The base resin may be a polymer resin. For example, the base resin may include an acrylic-based resin, a urethane-based resin, a silicon-based resin, and an epoxy-based resin. The base resin may be a transparent resin.

The quantum dots may be particles that convert a wavelength of incident light. Each of the quantum dots may be a material having a crystal structure having a size of several nanometers. The quantum dot may be composed of hundreds to thousands of atoms to provide a quantum confinement effect in which an energy band gap increases due to the small size. When light having a wavelength with energy greater than that of the band gap is incident into the quantum dots, the quantum dots may absorb the light and thus be in an excited state to emit light having a specific wavelength, thereby becoming a ground state. The emitted light has a value corresponding to the band gap. When the quantum dots are adjusted in size and composition, light emitting characteristics due to the quantum confinement effect may be adjusted.

The quantum dots may be selected from Group II-VI compounds, Group III-V compounds, Group IV-VI compounds, Group IV elements, Group IV compounds, and a combination thereof.

The Group II-VI compounds may be selected from binary element compounds selected from the group consisting of CdSe, CdTe, CdS, ZnS, ZnSe, ZnTe, ZnO, HgS, HgSe, HgTe, MgSe, MgS, and a combination thereof, ternary element compounds selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The group compounds may be selected from ternary compounds selected from the group consisting of AgInS2, CuInS2, AgGaS2, CuGaS2 and mixtures thereof or quaternary compounds such as AgInGaS2 and CuInGaS2.

The Group III-V compounds may be selected from binary element compounds selected from the group consisting of GaN, GaP, GaAs, GaSb, AlN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compounds may further include the Group II metal. For example, InZnP or the like may be selected as the group V compounds.

The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. The Group IV elements may be selected from the group consisting of Si, Ge, and a combination thereof. The Group IV compounds may be binary element compounds selected from the group consisting of SiC, SiGe, and a combination thereof.

Here, the binary element compounds, the ternary element compounds, and the quaternary element compounds may exist in the particle at a uniform concentration or exist in the particle in a state in which concentration distribution is partitioned into partially different states.

The quantum dots may have a core shell structure including a shell surrounding a core. Alternatively, the quantum dot may have a core/shell structure in which one quantum dot surrounds the other quantum dot. An interface between the core and the shell may have a concentration gradient in which an element existing in the shell has a concentration that gradually decreases toward the core.

Each of the quantum dots may have a particle having a size of a nano scale. The quantum dots may have a full width of half maximum (FWHM) of an emission wavelength spectrum of about 45 nm or less, for example, about 40 nm or less, or for example, about 30 nm or less. In this range, color purity and color reproducibility may be improved.

Also, light emitted through the quantum dots may be emitted in all directions to improve an optical viewing angle.

Also, each of the quantum dots has a shape that is generally used in the art and is not specifically limited in shape. However, the quantum dot may have a spherical shape, a pyramidal shape, a multi-arm shape, a cubic nanoparticle shape, a nanotube shape, a nanowire shape, a nanofiber shape, a nanoplate particle shape, or the like. The quantum dot may adjust a color of emitted light according to a size thereof. Thus, the quantum dot may emit light having various colors such as a red color, a green color, and a blue color.

According to some embodiments, the first color control pattern may be a red quantum dot pattern generating red light after absorbing the source light, and the second color control pattern may be a green quantum dot pattern generating green light after absorbing the source light.

FIG. 3b illustrates a first color filter CF-R, a third color filter CF-B, and a first color control pattern CCF-R. The third color filter CF-B is located on the peripheral area NPXA, and a first pixel opening B-OP (hereinafter, referred to as a first opening) defining the first pixel area PXA-R is defined in the third color filter CF-B. As will be described later with reference to FIG. 4c, a first pixel opening B-OP defining the second pixel area PXA-G is further formed in the first division pattern CF-B. According to some embodiments, the third color filter CF-B may correspond to the division pattern that partitions the first pixel area PXA-R from other pixel areas.

The first color filter CF-R overlaps the first opening B-OP and is located below the third color filter CF-B in the peripheral area NPXA.

A first encapsulation layer ENL1 is located under the first color filter CF-R and the third color filter CF-B. The first encapsulation layer ENL1 seals the first color filter CF-R and the third color filter CF-B. The first encapsulation layer ENL1 may be commonly located on the first to third pixel areas PXA-R, PXA-G, and PXA-B (see FIG. 3a).

A partition wall BW is located below the first encapsulation layer ENL1. According to some embodiments, the partition wall BW may be a black matrix as a pattern having a black color. According to some embodiments, the partition wall BW may include a black coloring agent. A black component may include a black dye and a black pigment. The black component may include carbon black, a metal such as chromium, or oxide thereof.

The partition wall BW corresponds to another division pattern that is distinguished from the third color filter CF-B. According to some embodiments, the third color filter CF-B may be defined as a first division pattern, and the partition wall BW may be defined as a second division pattern. An opening BW-OP (hereinafter, referred to as a common opening) is defined in the second division pattern BW. A first color control pattern CCF-R overlapping the common opening BW-OP is located under the first encapsulation layer ENL1. The second encapsulation layer ENL2 seals the second division pattern BW and the first color control pattern CCF-R. The second encapsulation layer ENL2 may be commonly located on the first to third pixel areas PXA-R, PXA-G, and PXA-B. As illustrated in FIG. 3b, a width of the common opening BW-OP in the first direction DR1 may be greater than that of the first opening B-OP. According to some embodiments, a size of the common opening BW-OP may be larger than that of the first opening B-OP on the plane.

Figure 4A:
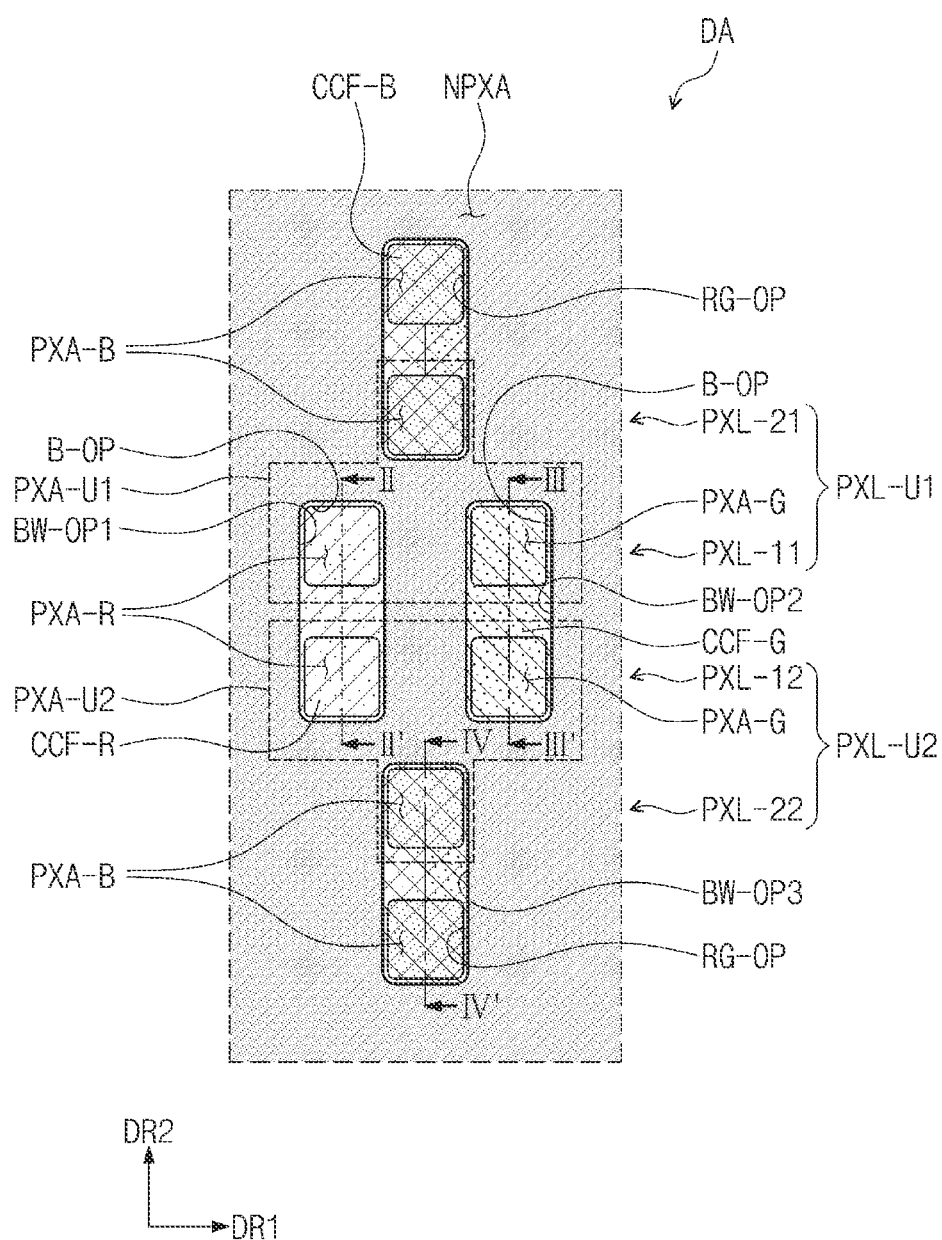
FIG. 4a is an enlarged plan view of a display area according to some embodiments of the present invention.

FIG. 4a is an enlarged plan view of the display area DA according to some embodiments of the present invention.

Figure 4B:
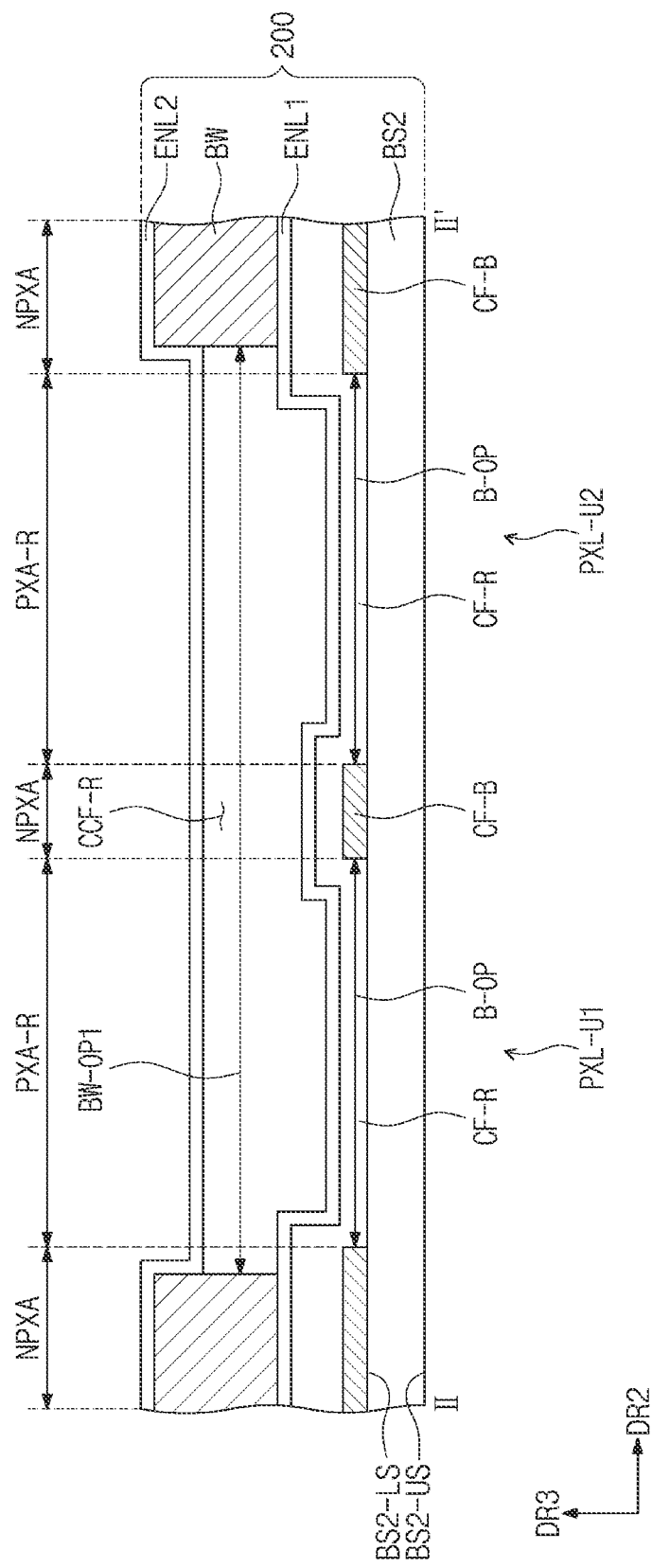

FIG. 4*b* is a cross-sectional view taken along the line II-II' of FIG. 4*a*. FIGS. 4*c* to 4*f* are plan views illustrating a method for fabricating a second display substrate 200 according to some embodiments of the present invention. FIG. 4*g* is a cross-sectional view illustrating one process in the method for fabricating the second display substrate 200 according to some embodiments of the present invention.

FIG. 4*b* illustrates the second display substrate 200 of FIG. 3*b* in an inverted state in the third direction DR3. That is, FIG. 4*b* is illustrated based on the bottom surface BS2-LS of the second base substrate BS2. According to some embodiments, the cross-section corresponding to a line III-III' of FIG. 4*a* and the cross-section corresponding to a line IV-IV' of FIG. 4*a* are substantially the same as the cross-section illustrated in FIG. 4*b* except for types of color filter and color control pattern. In addition, FIGS. 4*c* to 4*f* are illustrated based on the bottom surface BS2-LS of the second base substrate BS2.

In FIG. 4*a*, two unit pixel rows PXL-U1 and PXL-U2 are illustrated as the center. For convenience of description, the upper unit pixel row PXL-U1 is defined as the first unit pixel row PXL-U1, and the lower unit pixel row PXL-U2 is defined as the second unit pixel row PXL-U2.

As illustrated in 4*a* and 4*b*, the first division pattern CF-B defines the first pixel area PXA-R of the first unit pixel row PXL-U1 and the first pixel area PXA-R of the second unit pixel row PXL-U2. For convenience of description, a pixel row provided in the first unit pixel row PXL-U1 is defined as a first pixel row PXL-11, and a pixel row provided in the second unit pixel row PXL-U2 is defined as a second pixel row PXL-12. Also, another pixel row provided in the first unit pixel row PXL-U1 is defined as a third pixel row PXL-21, and another pixel row provided in the second unit pixel row PXL-U2 is defined as a fourth pixel row PXL-22.

The first color filter CF-R overlaps each of the first pixel area PXA-R of the first pixel row PXL-11 and the first pixel area PXA-R of the second pixel row PXL-12. The second division pattern BW is located on the first inorganic layer ENL1 and overlaps the peripheral area NPXA.

The common opening BW-OP described with reference to FIG. 3*b* corresponds to the first common opening BW-OP1 of FIG. 4*a*. The first common opening BW-OP1 corresponds to the first pixel area PXA-R of the first pixel row PXL-11 and the first pixel area PXA-R of the second pixel row PXL-12. The first pixel area PXA-R of the first pixel row PXL-11 and the first pixel area PXA-R of the second pixel row PXL-12 are located inside the first common opening BW-OP1.

The second division pattern BW overlaps a non-pixel area NPXA located outside the two first pixel areas PXA-R, and the second division pattern BW does not overlap the non-pixel area NPXA located between the two first pixel areas PXA-R. On the plane, the second division pattern BW surrounds the two first pixel areas PXA-R.

The first color control pattern CCF-R is arranged to overlap the first common opening BW-OP1. The first color control pattern CCF-R overlaps the two first pixel areas PXA-R. The first color control pattern CCF-R also overlaps the non-pixel area NPXA located between the two first pixel areas PXA-R.

The first division pattern CF-B divides the first common opening BW-OP1 into two first pixel areas PXA-R. A portion of the first division pattern CF-B is located between the first pixel area PXA-R of the first pixel row PXL-11 and the first pixel area PXA-R of the second pixel row PXL-12. The first color control pattern CCF-R overlaps a portion of the first division pattern CF-B between the first pixel area PXA-R of the first pixel row PXL-11 and the first pixel areas PXA-R of the second pixel row PXL-12.

The two first pixel areas PXA-R correspond to two different pixels PX (see FIG. 2). The first division pattern CF-B blocks the source light so that the source light is not incident into another first pixel area PXA-R when the source light is incident into any one of the two first pixel areas PXA-R. That is, the first division pattern CF-B may prevent crosstalk between two different pixels PX from occurring.

Figure 4C:
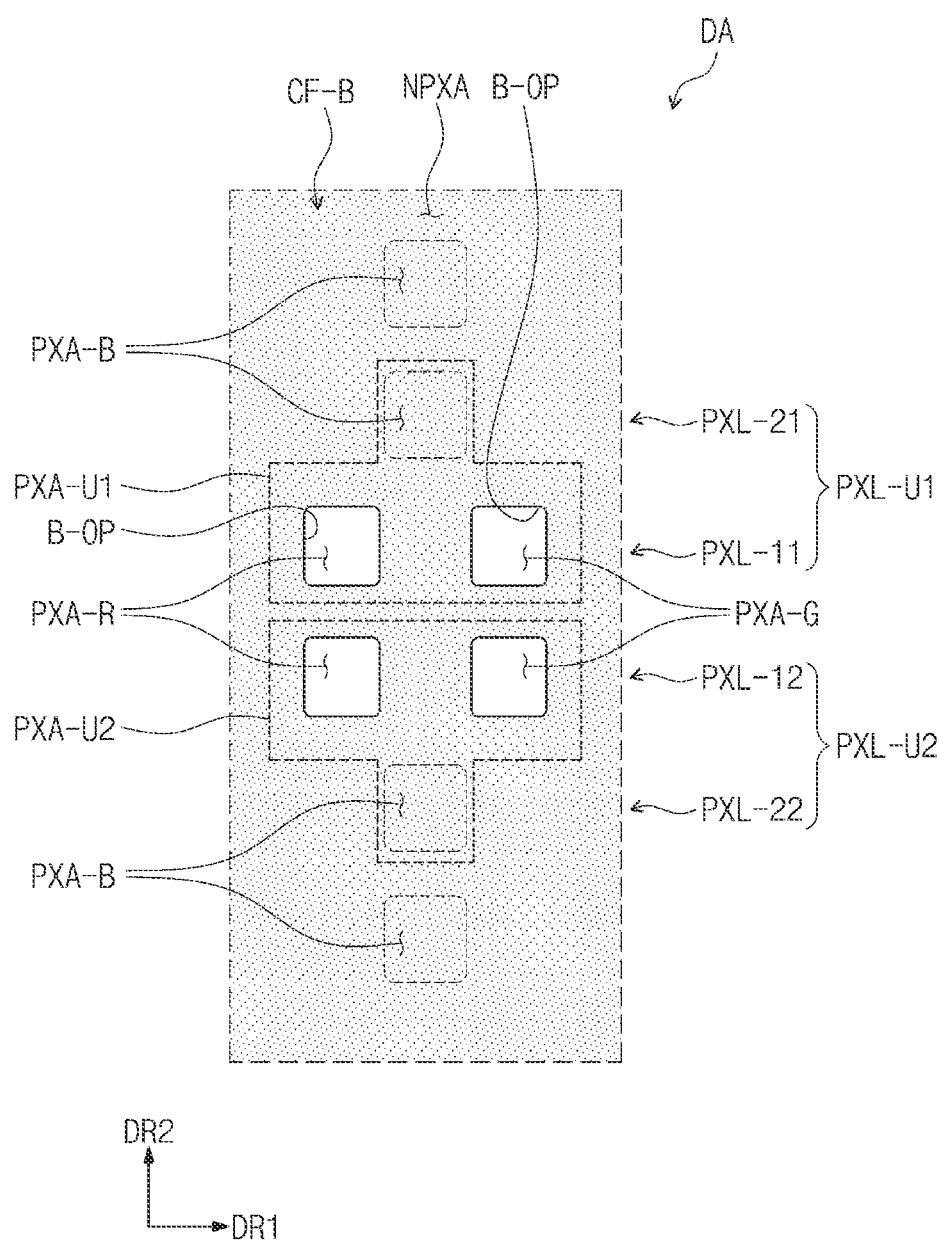
FIGS. 4c to 4f are plan views illustrating a method for fabricating an upper display substrate according to some embodiments of the present invention.

Referring to FIG. 4*c*, first, a first division pattern CF-B is formed on one surface BS2-LS of the second base substrate BS2. First openings B-OP defining the first pixel area PXA-R and the second pixel area PXA-G are formed in the first division pattern CF-B.

The first division pattern CF-B may be formed by a general color filter patterning process. After a preliminary color filter layer is formed, the first openings B-OP are formed in the preliminary color filter layer through a photo process.

According to some embodiments, because the first division pattern CF-B is substantially a blue color filter CF-B, the first division pattern CF-B overlaps the third pixel area PXA-B. In FIG. 4*c*, the third pixel area PXA-B is indicated by a dotted line because it is a virtual area. Also, the first division pattern CF-B is located on the non-pixel area NPXA.

Figure 4D:
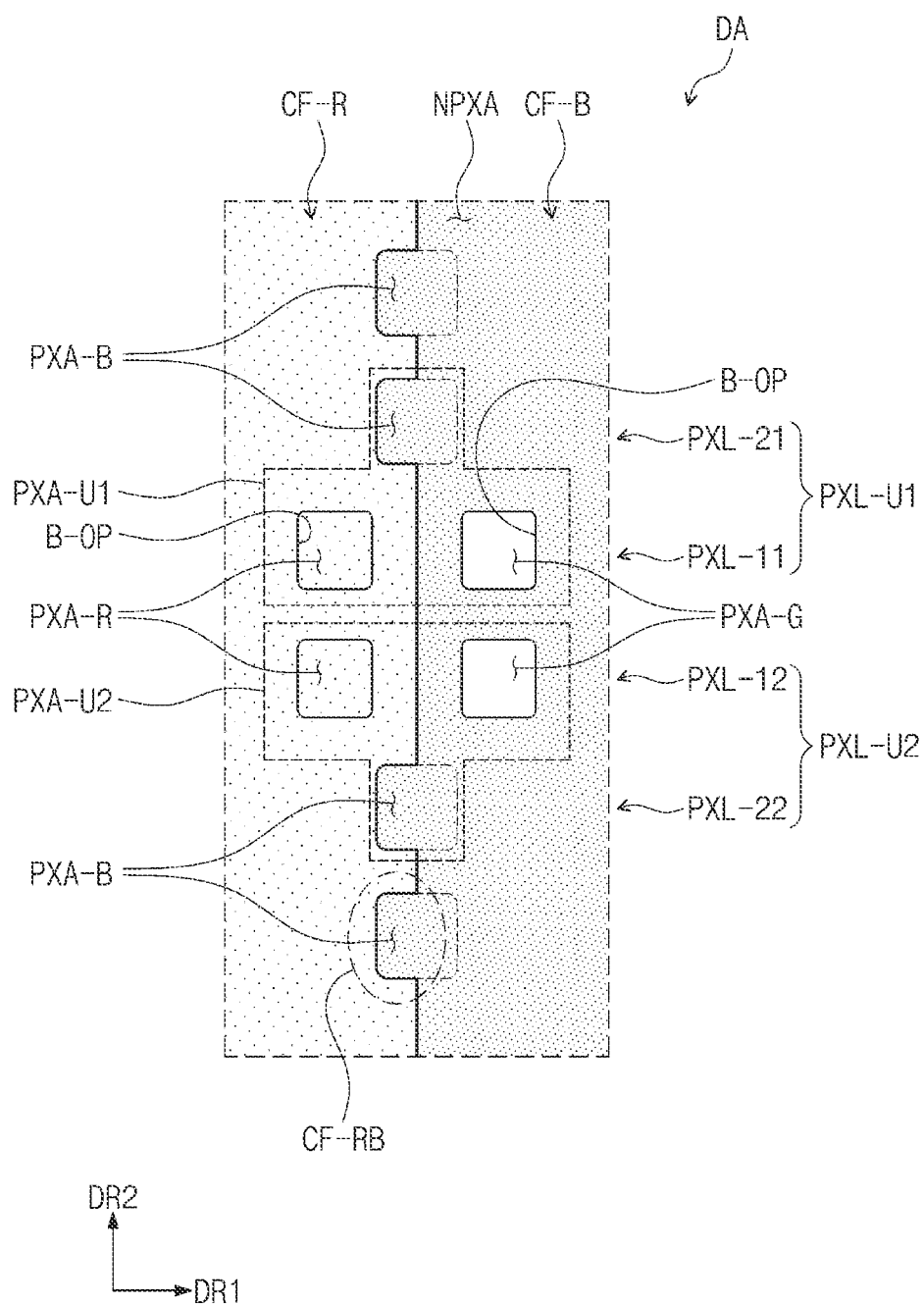

Next, as illustrated in FIG. 4*d*, a first color filter CF-R is formed on one surface BS2-LS of the second base substrate BS2. The first color filter CF-R is located on the first division pattern CF-B. The first color filter CF-R overlaps the first pixel area PXA-R and a portion of the non-pixel area NPXA. The first color filter CF-R does not overlap the second pixel area PXA-G. An area CF-RB having a predetermined shape to define a portion of the third pixel area PXA-B is formed on the first color filter CF-R.

Figure 4E:
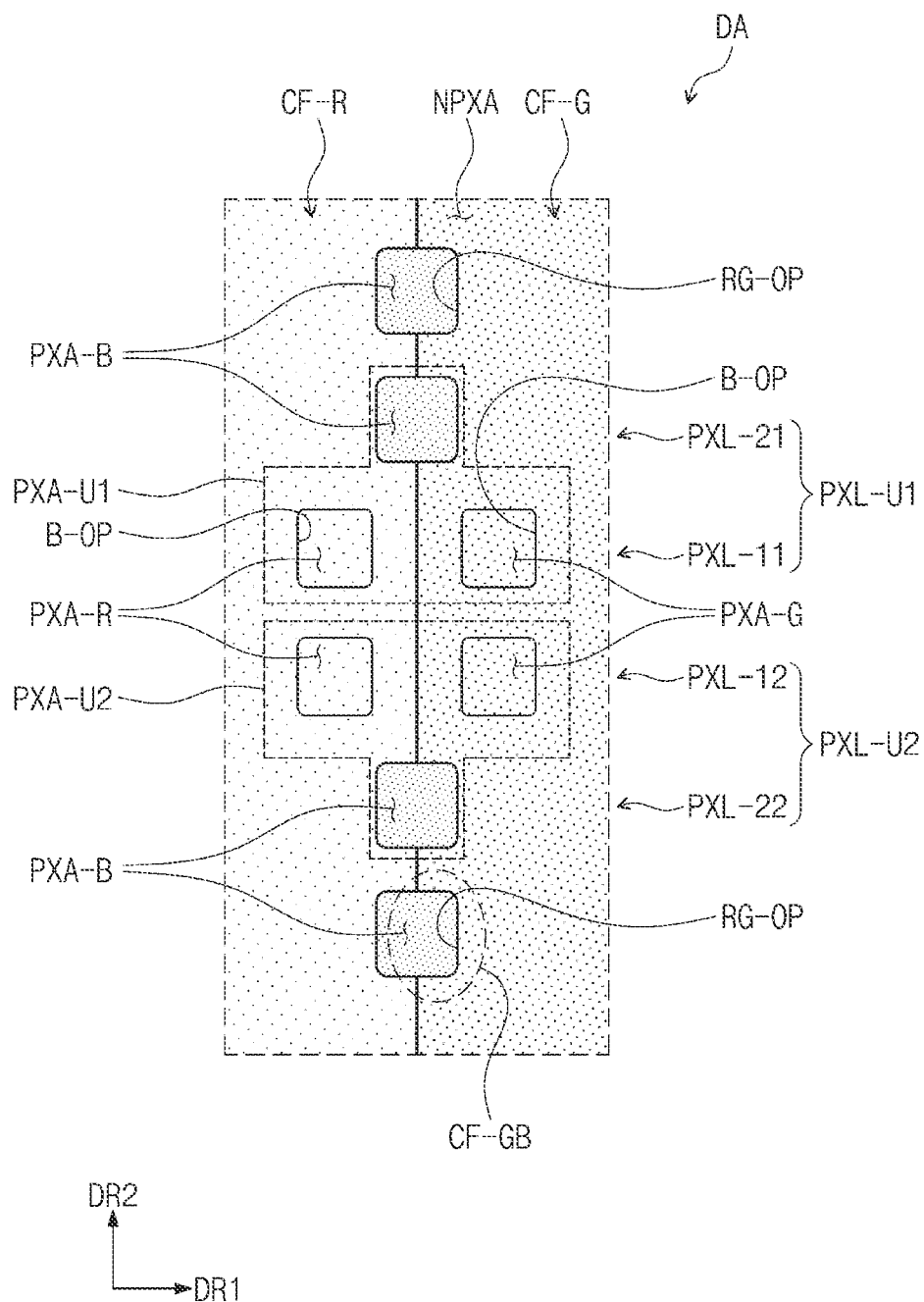

Next, as illustrated in FIG. 4*e*, a second color filter CF-G is formed on one surface BS2-LS of the second base substrate BS2. The second color filter CF-G is located on the first division pattern CF-B. The second color filter CF-G overlaps the second pixel area PXA-G and the other partial non-pixel area NPXA on which the first color filter CF-R is not formed. An area CF-GB having a predetermined shape to define a portion of the third pixel area PXA-B is formed on the second color filter CF-G.

A partial area CF-RB of the first color filter CF-R of FIG. 4*d* and a partial area CF-GB of the second color filter CF-G of FIG. 4*e* may form a second pixel opening RG-OP (hereinafter, referred to as a second opening) substantially defining the third pixel area PXA-B. The third pixel area PXA-B is an area, on which both the first color filter CF-R and the second color filter CF-G are not located, and is defined by an edge of a portion of the first color filter CF-R and an edge of a portion of the second color filter CF-G.

Although the first color filter CF-R and the second color filter CF-G are illustrated as non-overlapping in FIG. 4*e*, the first color filter CF-R and the second color filter CF-G may partially overlap each other within the non-pixel area NPXA. Thereafter, the first inorganic layer ENL1 of FIG. 4*b* may be formed through an inorganic material deposition process.

Figure 4F:
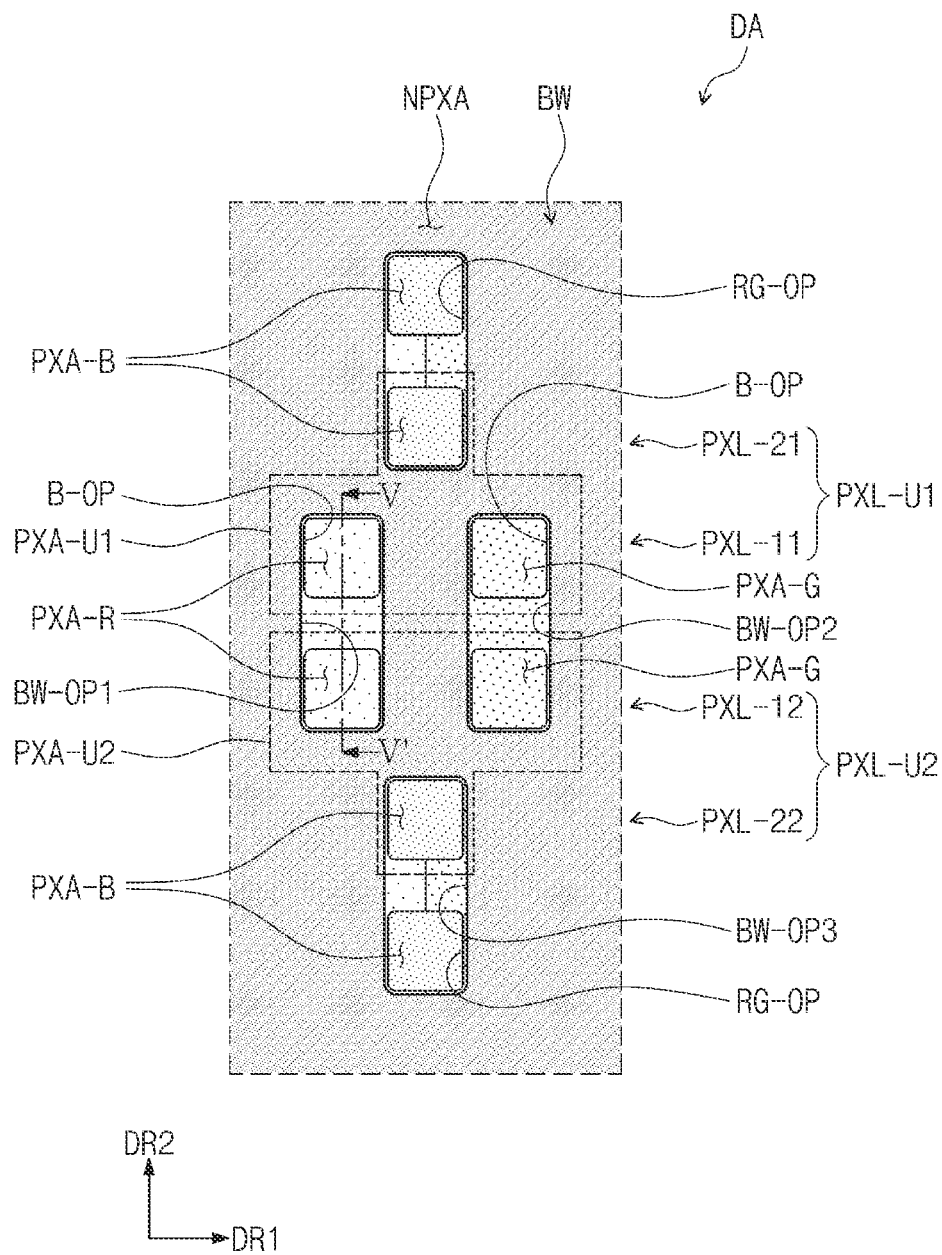
Figure 4G:
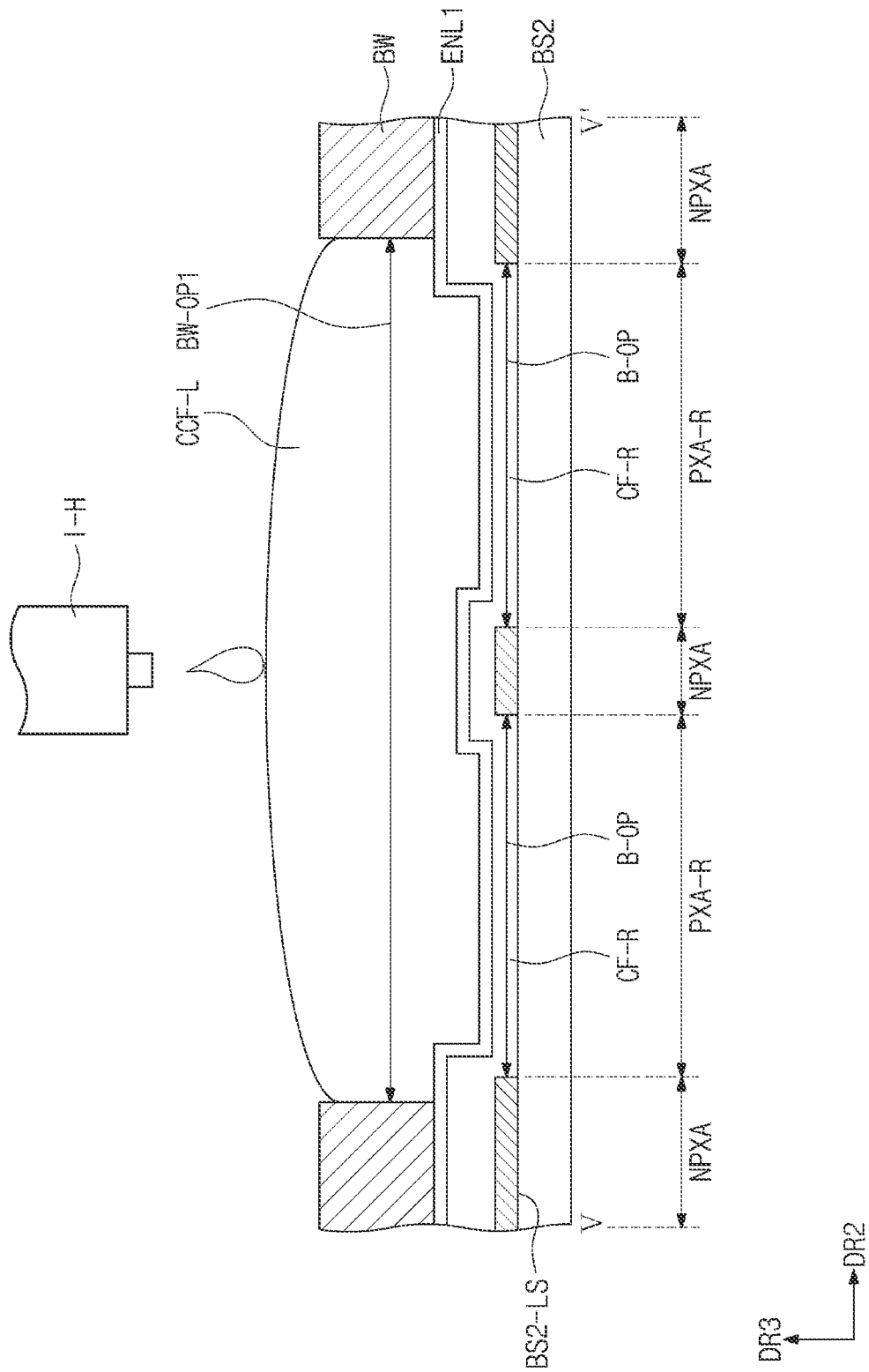
FIG. 4g is a cross-sectional view illustrating one process in the method for fabricating the upper display substrate according to some embodiments of the present invention.

Next, as illustrated in FIG. 4*f*, the second division pattern BW overlapping the non-pixel area NPXA is formed. A plurality of common openings BW-OP1, BW-OP2, and BW-OP3 are defined in the second division pattern BW. The common opening BW-OP1 corresponding to the two first pixel areas PXA-R may be defined as a first common opening, the common opening BW-OP2 corresponding to the two second pixel areas PXA-G may be defined as a second common opening, and the common opening BW-OP3 corresponding to the two third pixel areas PXA-B may be defined as a third common opening. After forming the preliminary partition layer, a plurality of common openings BW-OP1, BW-OP2, and BW-OP3 may be formed in the preliminary partition layer through a photo process.

Next, after the second division pattern BW is formed on the first inorganic layer ENL1, color control patterns may be formed in the plurality of common openings BW-OP1, BW-OP2, BW-OP3. The first color control pattern, the second color control pattern, and the third color control pattern, which respectively correspond to the first common opening BW-OP1, the second common opening BW-OP2, and the third common opening BW-OP3, may be sequentially formed.

FIG. 4g is a cross-sectional view taken along line V-V' of FIG. 4f. A method for forming the first color control pattern CCF-R of FIG. 4b will be described with reference to FIG. 4g. As illustrated in FIG. 4g, the first color control pattern CCF-R of FIGS. 4a and 4b may be formed using a solution CCF-L (hereinafter, referred to as a pattern solution). The pattern solution for forming the first color control pattern CCF-R may be a quantum dot solution. The pattern solution for forming the second color control pattern CCF-G of FIG. 4a may be a quantum dot solution, and the pattern solution for forming the third color control pattern CCF-B may be a scattering particle solution.

For example, in an inkjet process, the pattern solution CCF-L is provided to the first common opening BW-OP1 in an inkjet head I-H. In order to accommodate a sufficient amount of pattern solution CCF-L, the second division pattern BW has a thickness greater than that of the first division pattern CF-B. The pattern solution CCF-L may include silver quantum dot particles. The quantum dot particles may not be added to the pattern solution CCF-L for forming the third color control pattern. The pattern solution CCF-L may further include silver scattering particles and a surfactant. In addition, the pattern solution CCF-L may further include epoxy or epoxy-acrylate. For example, the pattern solution CCF-L may further include methyl-methacrylate (MMA) or polymethyl-metha-acrylate (PMMA). The pattern solution CCF-L may further include a solvent for the inkjet process.

In a liquid phase process such as the inkjet process, a predetermined amount or more of solution has to be provided to form a color control pattern having a predetermined thickness or more. When a volume of a space defined by an opening formed in the second division pattern BW is larger than a reference volume, a process condition of the liquid phase process is satisfied. Here, the reference volume means a minimum volume for preventing the solution from overflowing into an adjacent opening when the predetermined amount of solution is provided to one opening.

One first common opening BW-OP1 may correspond to the two first pixel areas PXA-R to provide a sufficient space for forming the color control pattern. That is, the second division pattern BW according to some embodiments may relatively easily satisfy the liquid phase process conditions. In addition, a thickness of the second division pattern BW may be reduced within a range in which the liquid phase process conditions are satisfied.

Also, a difference in surface area between the two first pixel areas PXA-R and the first common opening BW-OP1 may be minimized or reduced. In other words, there is no need to intentionally (or purposely) form an opening size of the opening formed in the second division pattern BW, which is larger than that of the corresponding pixel area so as to satisfy the liquid phase process conditions. This is because the first common opening BW-OP1 provides a sufficient volume. As the surface area of the non-pixel area NPXA, which is not covered by the second division pattern BW, is reduced, reflectance of external light is reduced.

It is not necessary to control a shape of the first common opening BW-OP1 to intentionally increase in size of the opening. Because the shape of the first common opening BW-OP1 is simplified, a process error is reduced.

Thereafter, the second inorganic layer ENL2 of FIG. 4b may be formed through an inorganic material deposition process. Thereafter, the completed second display substrate 200 may be coupled to the first display substrate 100.

Figure 5A:
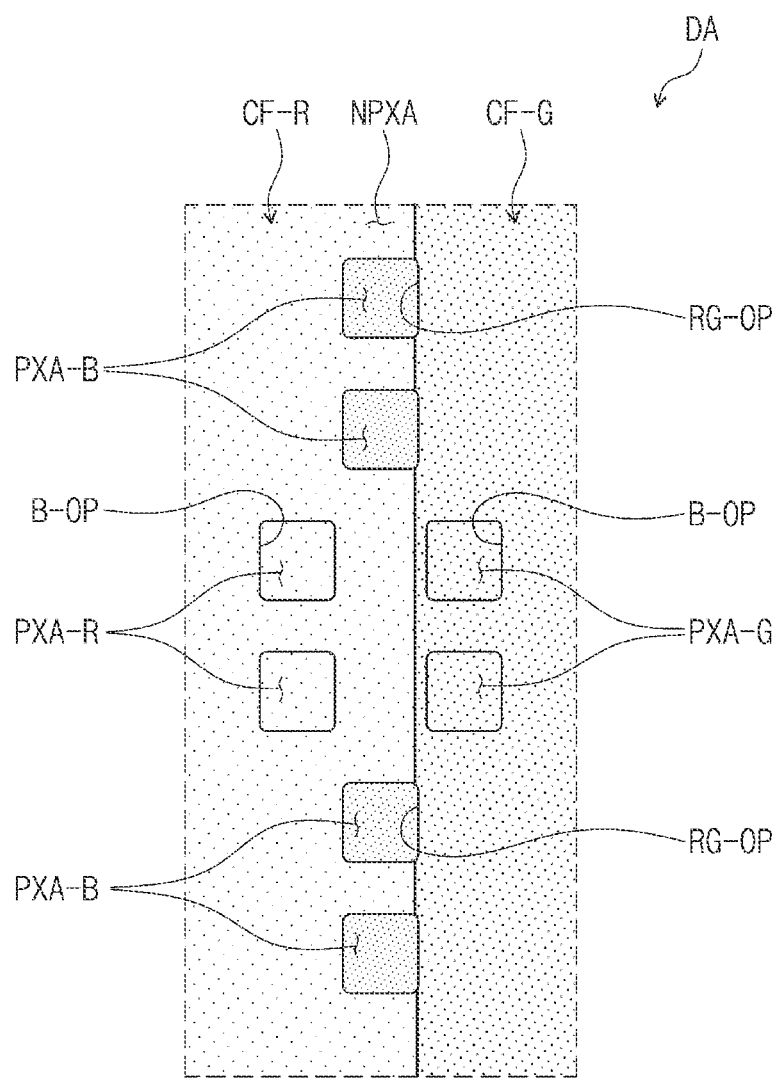
FIG. 5a is a plan view of a display area according to some embodiments of the present invention.
Figure 5B:
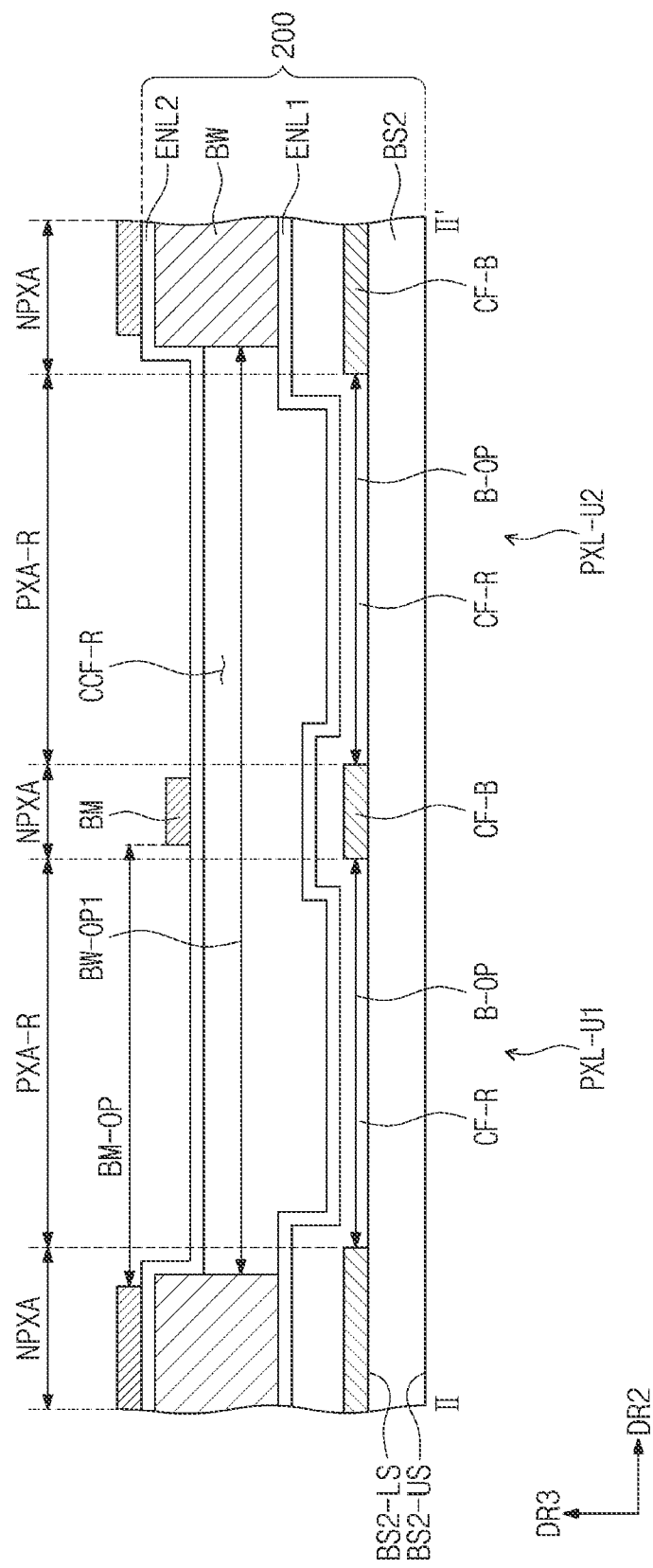
FIG. 5b is a cross-sectional view of the display area according to some embodiments of the present invention.
Figure 5C:
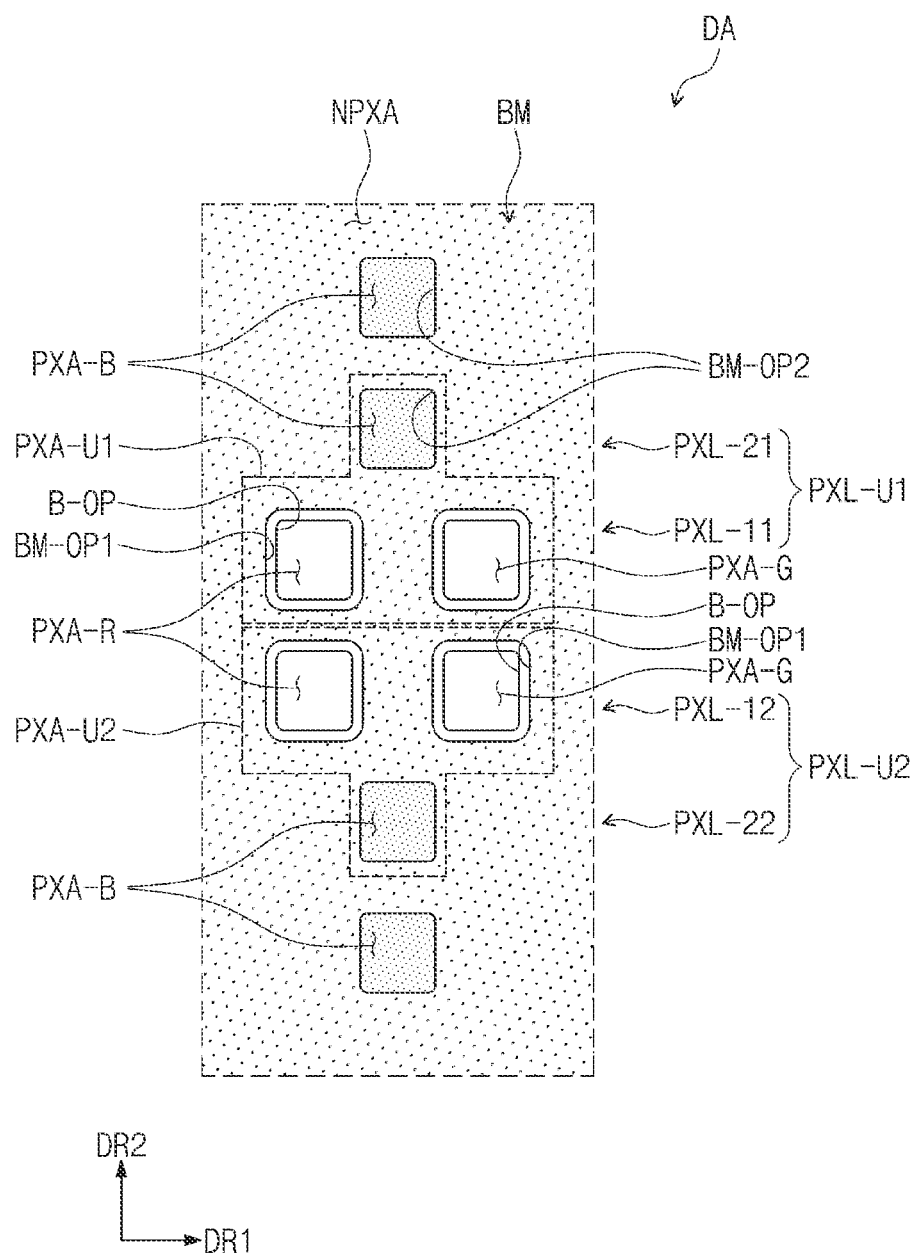
FIG. 5c is a plan view of a display area according to some embodiments of the present invention.

FIG. 5a is a plan view of a display area according to some embodiments of the present invention. FIG. 5b is a cross-sectional view of the display area according to some embodiments of the present invention. FIG. 5c is a plan view of a display area according to some embodiments of the present invention.

FIG. 5a corresponds to FIG. 4e, FIG. 5b corresponds to FIG. 4b, and FIG. 5c corresponds to FIG. 4c. Hereinafter, a detailed description of the same configuration as that described with reference to FIGS. 1a to 4g will be omitted.

Referring to FIG. 5a, a first color filter CF-R occupies a surface area greater than that of a second color filter CF-G in a third pixel area PXA-B, i.e., in a periphery of the second opening RG-OP. Because the first color filter CF-R transmits light having a wavelength longer than that of the second color filter CF-G, a blocking effect of source light (or blue light) having a shorter wavelength is greater than that of the second color filter CF-G. In a display area DA illustrated in FIG. 5a, leaking light generated around the third pixel area PXA-B may be further reduced than in the display area DA illustrated in FIG. 4e.

Referring to FIG. 5b, a third division pattern BM may be further located on a first color control pattern CCF-R. The third division pattern BM may include a black component. The third division pattern BM may be located on a second inorganic layer ENL2. The third division pattern BM blocks the source light so that the source light is not incident into another first pixel area PXA-R when the source light is incident into any one of the two first pixel areas PXA-R.

A plurality of openings BM-OP corresponding to the plurality of pixel areas PXA-R, PXA-G, and PXA-B illustrated in FIG. 3a may be defined in the third division pattern BM. An opening size of each of the plurality of openings BM-OP is greater than that of the corresponding opening of the first opening B-OP (see FIG. 4e) and the second opening RG-OP (see FIG. 4e).

Referring to FIG. 5c, a third division pattern BM may be further located on the first division pattern CF-B illustrated in FIG. 4c. The third division pattern BM may include a black component. A tenth opening BM-OP1 corresponding to the first opening B-OP and a twentieth opening BM-OP2 corresponding to the third pixel area PXA-B may be defined in the third division pattern BM.

The tenth opening BM-OP1 may have an opening size greater than that of the first opening B-OP. The twentieth opening BM-OP2 may substantially define the third pixel area PXA-B. After the process illustrated in FIG. 5c, the process of FIGS. 4d to 4g may be additionally performed. The opening size of the second opening RG-OP of FIG. 4d may be larger than that of the twentieth opening BM-OP2. Substantially, the third division pattern BM may be located between the first division pattern CF-B and the first color filter CF-R on the cross-section of FIG. 3b.

Figure 6A:
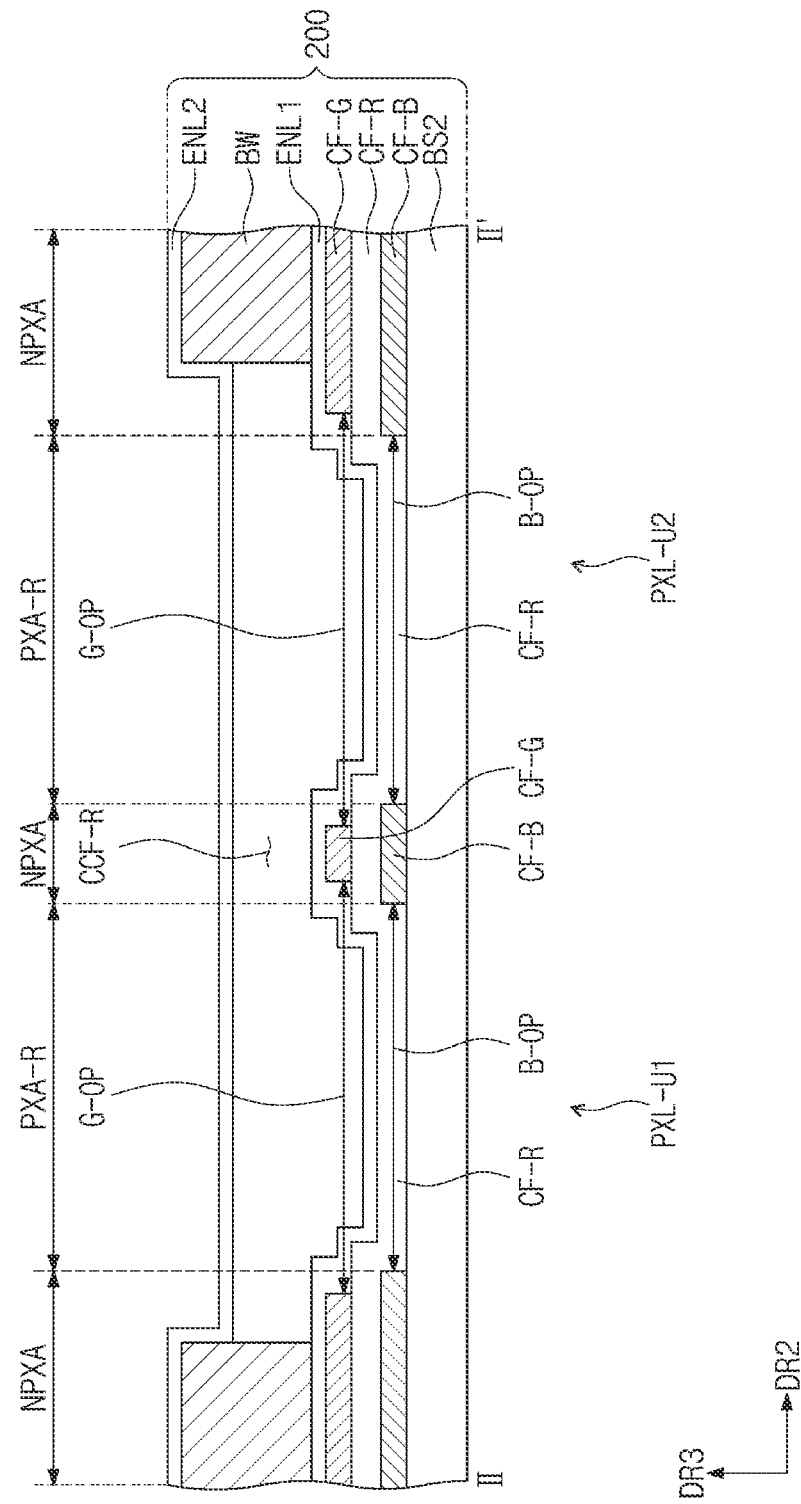
FIG. 6a is a cross-sectional view of an upper display substrate corresponding to the display area according to some embodiments of the present invention.

FIG. 6*a* is a cross-sectional view of an upper display substrate 200 corresponding to the display area according to some embodiments of the present invention. FIGS. 6*b* to 6*e* are plan views illustrating a method for fabricating an upper display substrate 200 according to some embodiments of the present invention. Hereinafter, detailed descriptions with respect to the same configuration as that described with reference to FIGS. 1*a* to 4*c* will be omitted.

As illustrated in FIG. 6*a*, a second color filter CF-G may be located on a first color filter CF-R within the peripheral area NPXA. A laminated structure of the first color filter CF-R, the second color filter CF-G, and a third color filter CF-B within the peripheral area NPXA substantially corresponds to a light blocking pattern. The laminated structure has a function of the third division pattern BM illustrated in FIG. 5*c*.

Figure 6B:
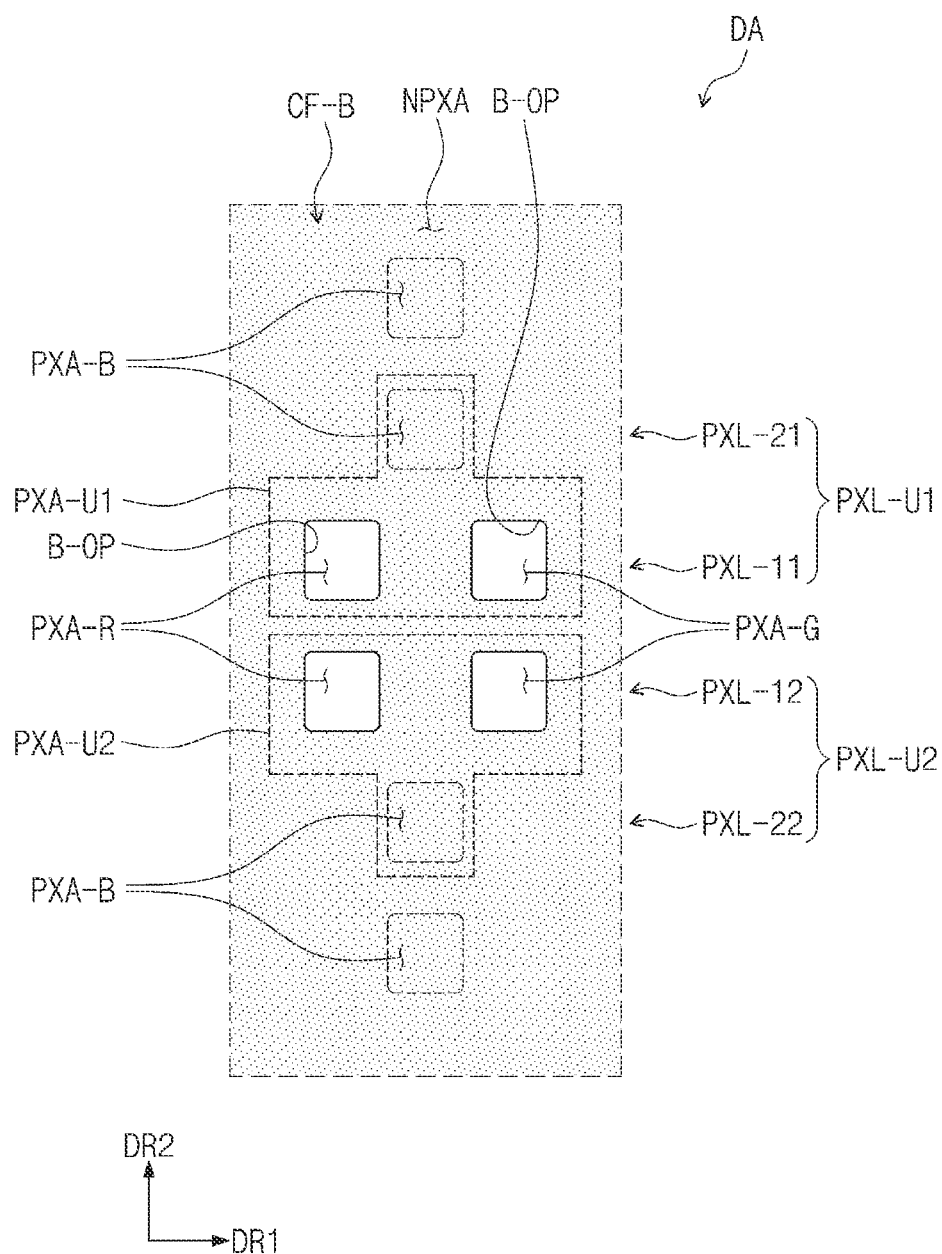
FIGS. 6b to 6e are plan views illustrating a method for fabricating an upper display substrate according to some embodiments of the present invention.

As illustrated in FIG. 6*b*, the third color filter CF-B is formed on one surface BS2-LS of a second base substrate BS2. Opening B-OP of a first group defining the first pixel area PXA-R and the second pixel area PXA-G are formed in the third color filter CF-B.

Figure 6C:
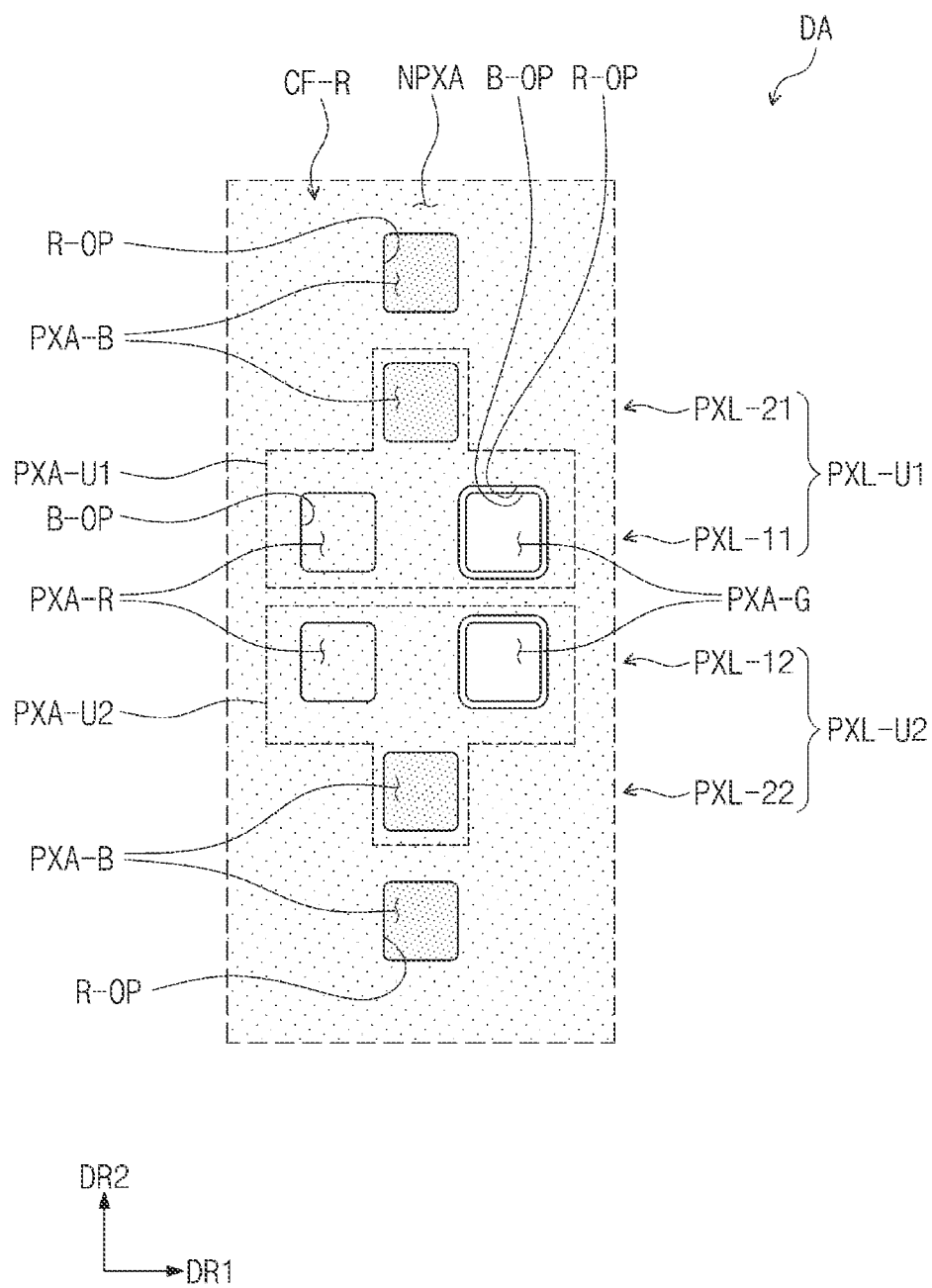

Next, as illustrated in FIG. 6*c*, the first color filter CF-R is formed on the third color filter CF-B. Openings R-OP of a second group corresponding to the second pixel area PXA-G and the third pixel area PXA-B are formed in the first color filter CF-R.

An opening size of each of the opening R-OP of the second group corresponding to the second pixel area PXA-G may be greater than that of each of the openings B-OP of the first group corresponding to the second pixel area PXA-G. Substantially, the third pixel area PXA-B may be defined by openings R-OP of a second group.

Figure 6D:
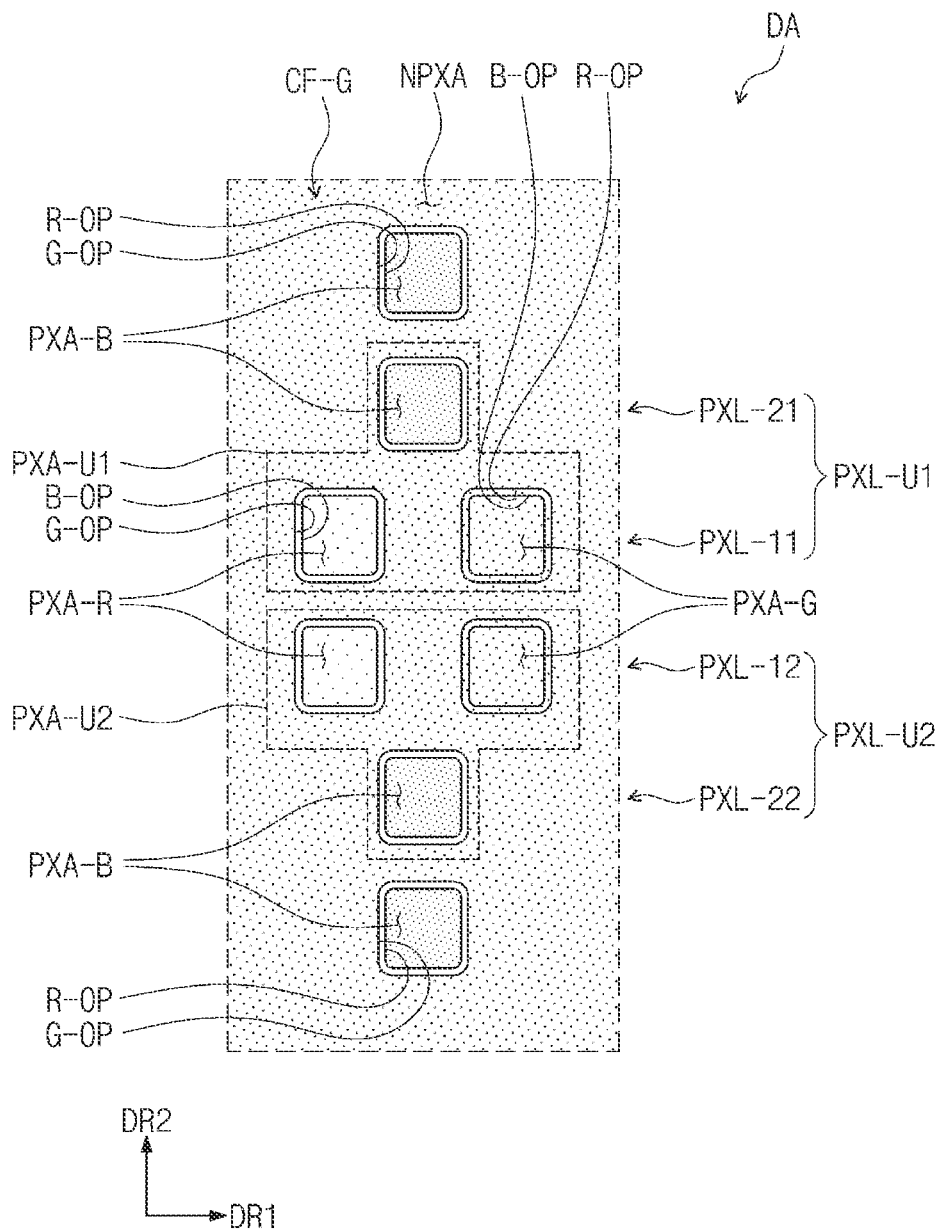

Next, as illustrated in FIG. 6*d*, a second color filter CF-G is formed on the first color filter CF-R. The second color filter CF-G overlaps the second pixel areas PXA-G of a first pixel row PXL-11 and a second pixel row PXL-12 and does not overlap the first pixel areas PXA-R. Openings G-OP of a third group corresponding to the first pixel area PXA-R and the third pixel area PXA-B are formed in the second color filter CF-G.

An opening size of each of the opening G-OP of the third group corresponding to the first pixel area PXA-R may be greater than that of each of the openings B-OP of the first group corresponding to the first pixel area PXA-R. According to some embodiments, although the opening size of each of the opening G-OP of the third group corresponding to the third pixel area PXA-B is greater than that of each of the openings R-OP of the second group corresponding to the third pixel area PXA-B, the present invention is not limited thereto. Also, a laminating order of the first color filter CF-R and the second color filter CF-G may be changed.

Figure 6E:
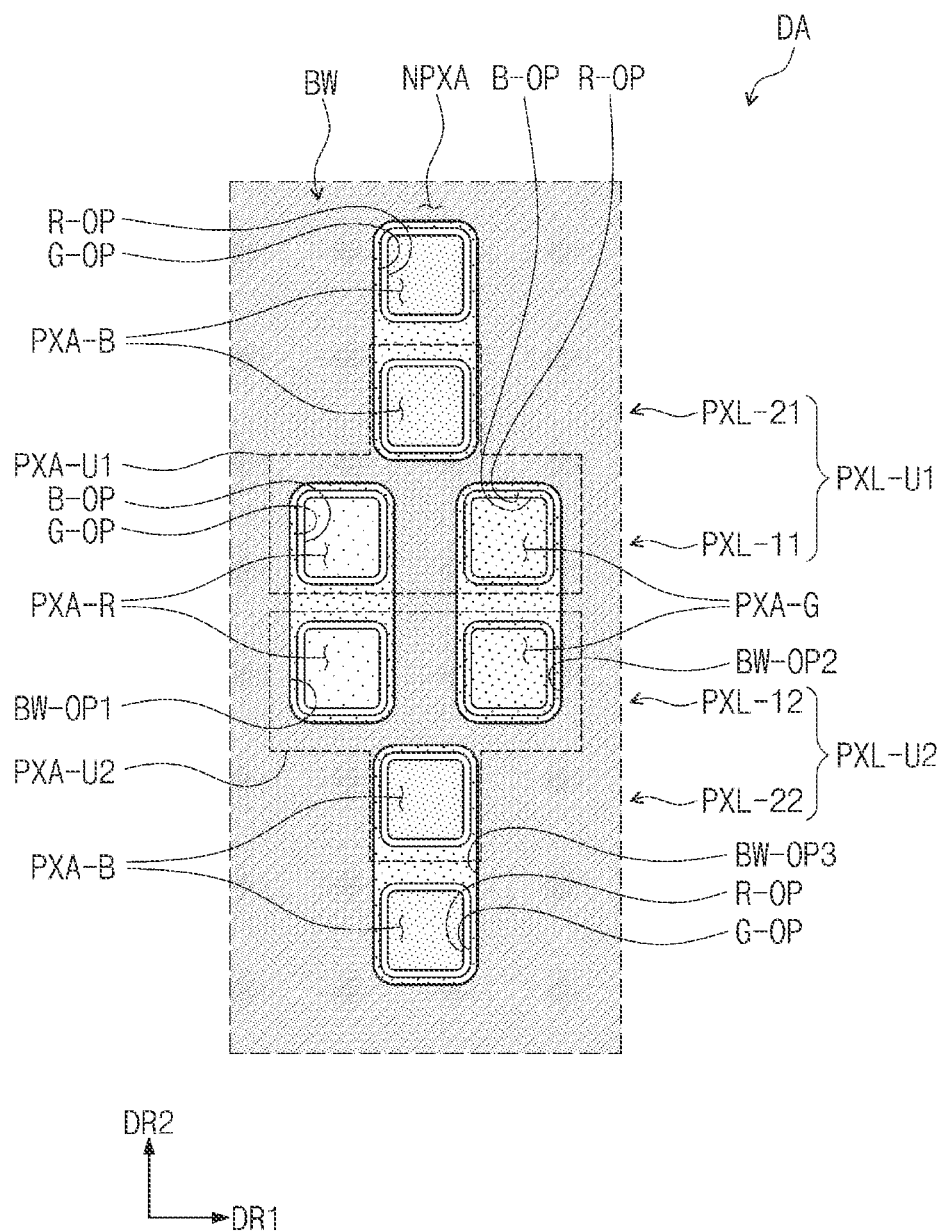

Next, as illustrated in FIG. 6*e*, a partition wall BW overlapping the non-pixel area NPXA is formed on the second color filter CF-G. Before forming the partition wall BW, a first inorganic layer ENL1 of FIG. 6*a* may be further formed through an inorganic material deposition process.

Figure 7:
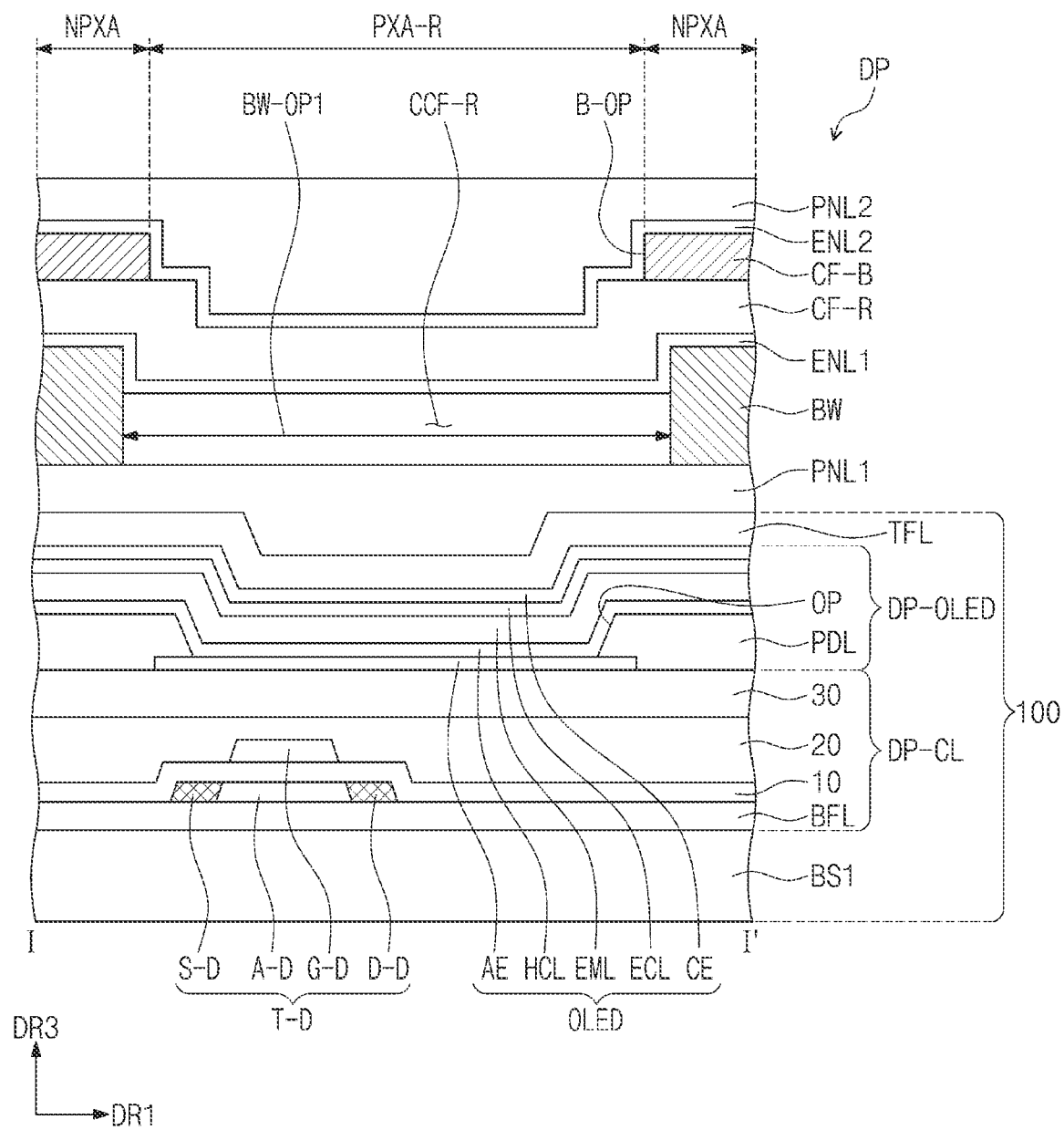
FIG. 7 is a cross-sectional view of the display panel according to some embodiments of the present invention.

FIG. 7 is a cross-sectional view of the display panel DP according to some embodiments of the present invention. FIG. 7 illustrates a cross-sectional view corresponding to the cross-sectional view of FIG. 3*b*. Hereinafter, detailed descriptions with respect to the same configuration as that described with reference to FIGS. 1*a* to 17*e* will be omitted.

Unlike the display panel DP illustrated in FIGS. 1*a* to 6*e*, a display panel DP according to some embodiments includes one base substrate BS1. In the fabricating process, a process of coupling a first display substrate 100 to a second display substrate 200 is omitted, and structures are sequentially formed on the base substrate BS1.

Referring to FIG. 7, a first planarization layer PNL1 may be located on an upper insulating layer TFL. The first planarization layer PNL1 may include an organic layer. According to some embodiments, the first planarization layer PNL1 may be omitted.

Structures located on the bottom surface BS2-LS of the second base substrate BS2 illustrated in FIG. 3*b* are located on the first planarization layer PNL1. The partition wall BW is located on the first planarization layer PNL1. A first color control pattern CCF-R is located in a first common opening BW-OP1. A first inorganic layer ENL1 is located on the partition wall BW and the first color control pattern CCF-R. A first color filter CF-R is located on the first inorganic layer ENL1.

A third color filter CF-B is located on the first color filter CF-R. A second inorganic layer ENL2 is located on the first color filter CF-R and the third color filter CF-B. A second planarization layer PNL2 may be located on the second inorganic layer ENL2. The second planarization layer PNL2 may include an organic layer. According to some embodiments, the second planarization layer PNL2 may be omitted.

According to some embodiments of the present invention, a protective substrate may be further located on the second planarization layer PNL2. The protective substrate may include a synthetic resin substrate or a glass substrate.

Figure 8A:
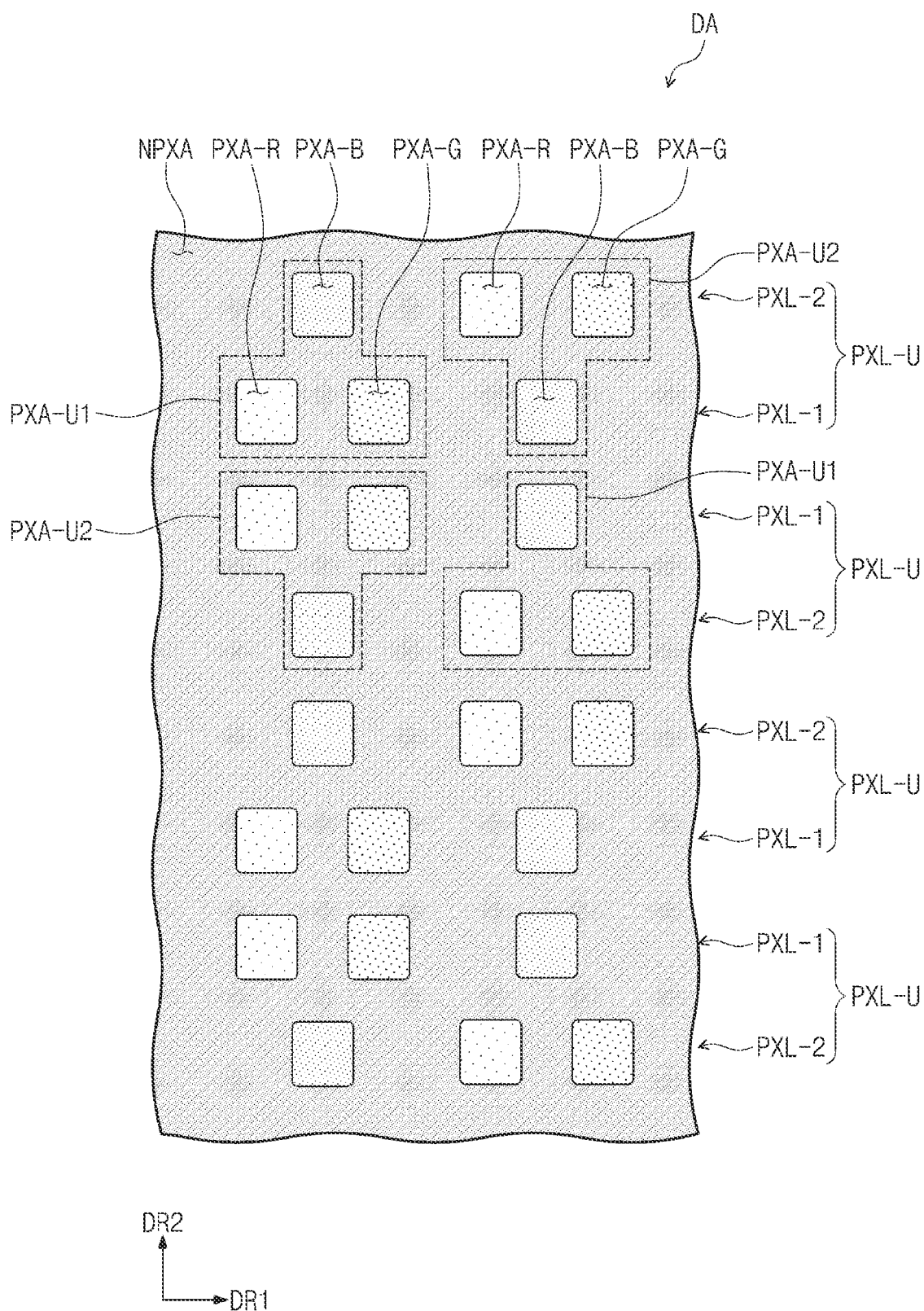
FIGS. 8a to 8c are plan views of a display area of the display panel according to some embodiments of the present invention.
Figure 8B:
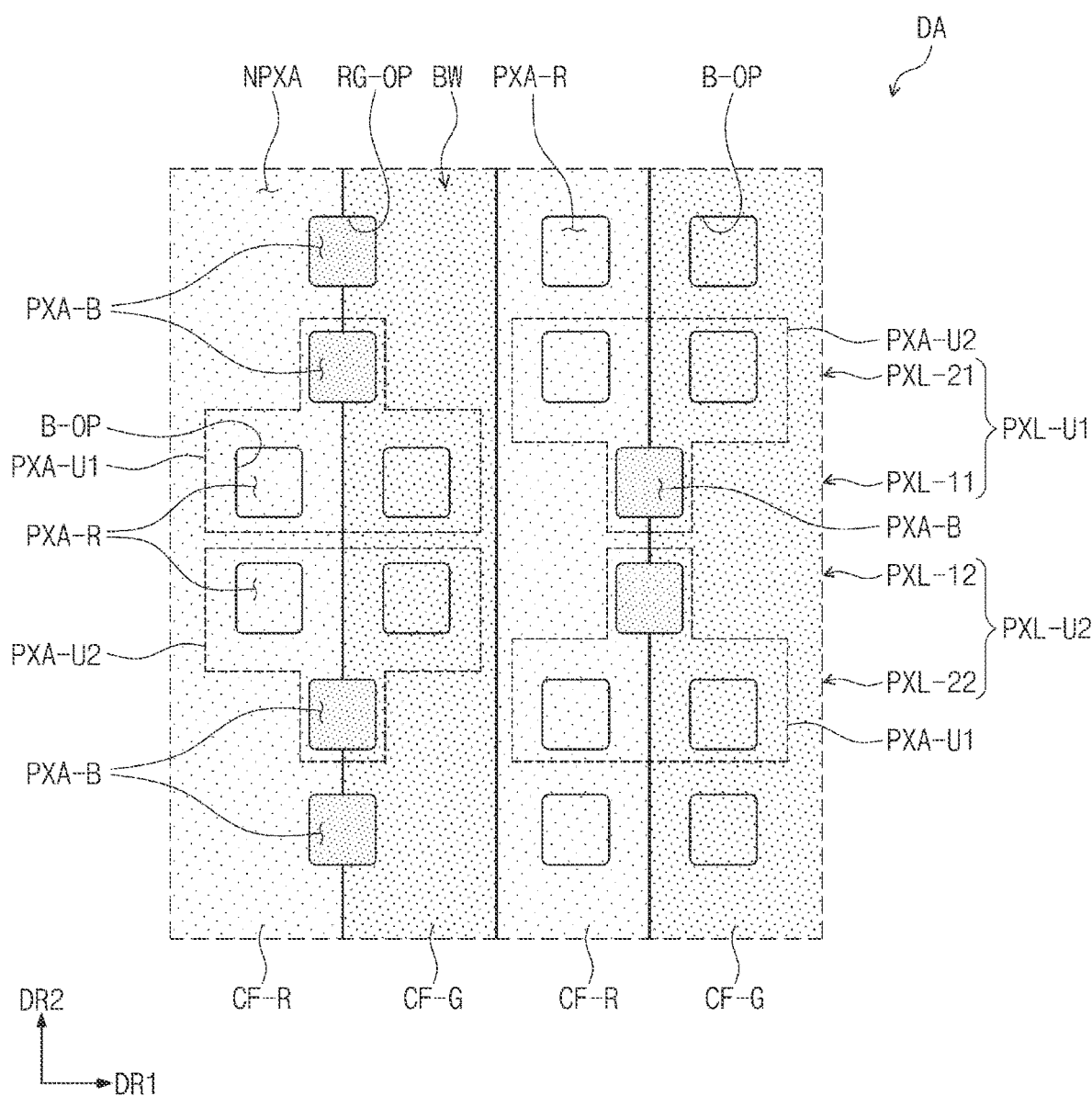
Figure 8C:
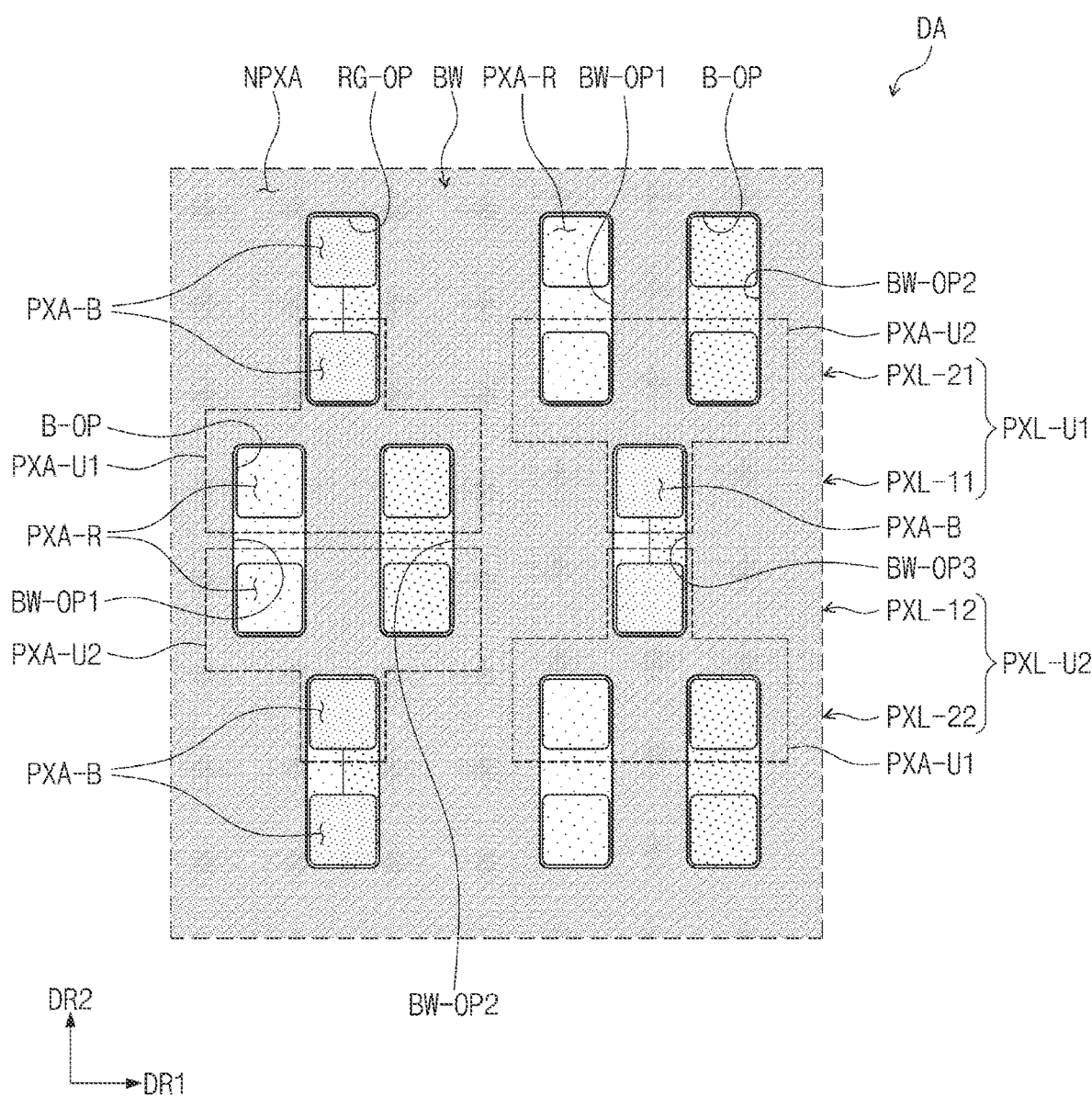

FIGS. 8*a* to 8*c* are plan views of a display area DA of the display panel according to some embodiments of the present invention. FIG. 8*a* corresponds to FIG. 3*a*, FIG. 8*b* corresponds to FIG. 4*e*, and FIG. 8*c* corresponds to FIG. 4*f*. Hereinafter, detailed descriptions with respect to the same constituent as that described with reference to FIGS. 1 to 7 will be omitted.

Referring to FIG. 8*a*, a plurality of pixel areas PXA-R, PXA-G, and PXA-B may be provided in a plurality of pixel rows PXL-1 and PXL-2 extending in the first direction DR1. Pixel rows PXL-1 of a first group and pixel rows PXL-2 of a second group successively arranged along the second direction DR2 may define one unit pixel row PXL-U.

The unit pixel row PXL-U includes first unit areas PXA-U1 and second unit areas PXA-U2, which are alternately arranged along the first direction DR1. Detailed descriptions of the first unit areas PXA-U1 and the second unit areas PXA-U2 refer to FIG. 3*a*. Because the adjacent unit pixel rows PXL-U have different arrangements of the first unit area PXA-U1 and the second unit area PXA-U2, image spots may be reduced. This is because each of the pixel rows PXL-1 and PXL-2 includes a first pixel area PXA-R, a second pixel area PXA-G, and a third pixel area PXA-B. In other words, this is because a specific pixel row does not include only a specific pixel area.

FIGS. 8*b* and 8*c* illustrate the first unit pixel row PXL-U1 and the second unit pixel row PXL-U2, which are continuous in the second direction. The first unit area PXA-U1 of the first unit pixel row PXL-U1 and the second unit area PXA-U2 of the second unit pixel row PXL-U2 are aligned in the second direction DR2, and the second unit area PXA-U2 of the first unit pixel row PXL-U1 and the first unit area PXA-U1 of the second unit pixel row PXL-U2 are aligned in the second direction DR2. As illustrated in FIG. 8*b*, the first color filters CF-R and the second color filters CF-G are alternately arranged along the first direction DR1. The first color filters CF-R overlap the first pixel area PXA-R of the first unit pixel row PXL-U1 and the first pixel areas PXA-R of the second unit pixel row PXL-U2, which are aligned in the second direction DR2, respectively. The second color filters CF-G overlap the second pixel area PXA-G of the first unit pixel row PXL-U1 and the second pixel areas PXA-G of the second unit pixel row PXL-U2, which are aligned in the second direction DR2, respectively. The first color filters CF-R and the second color filters CF-G define a second opening RG-OP corresponding to the third pixel area PXA-B.

As illustrated in FIG. 8c, a first common opening BW-OP1, a second common opening BW-OP2, and a third common opening BW-OP3 are defined in a second division pattern BW. The first common opening BW-OP1 corresponds to the first pixel area PXA-R of the first unit pixel row PXL-U1 and the first pixel area PXA-R of the second unit pixel row PXL-U2, which are aligned in the second direction DR2. According to some embodiments, as described with reference to FIG. 4a, a first color control pattern CCF-R is located in the first common opening BW-OP1. A second color control pattern CCF-G may be located in the second common opening BW-OP2, and a third color control pattern CCF-B may be located in the third common opening BW-OP3.

According to some embodiments, color filters CF-R and CF-G of FIG. 8b may be modified, like the color filters CF-R and CF-G illustrated in FIGS. 5a and 5b. In addition, in the display area DA described with reference to FIGS. 8a to 8c, the third division pattern BM described with reference to FIG. 5c may be further located. In addition, the color filters CF-R, CF-G, and CF-B described with reference to FIGS. 8a to 8c may be modified, like the color filters CF-R, CF-G, and CF-B described with reference to FIGS. 6a to 6e. Also, the display area DA described with reference to FIGS. 8a to 8c may be applied to a display panel including one base substrate BS1, like the display panel DP described with reference to FIG. 7.

Figure 9A:
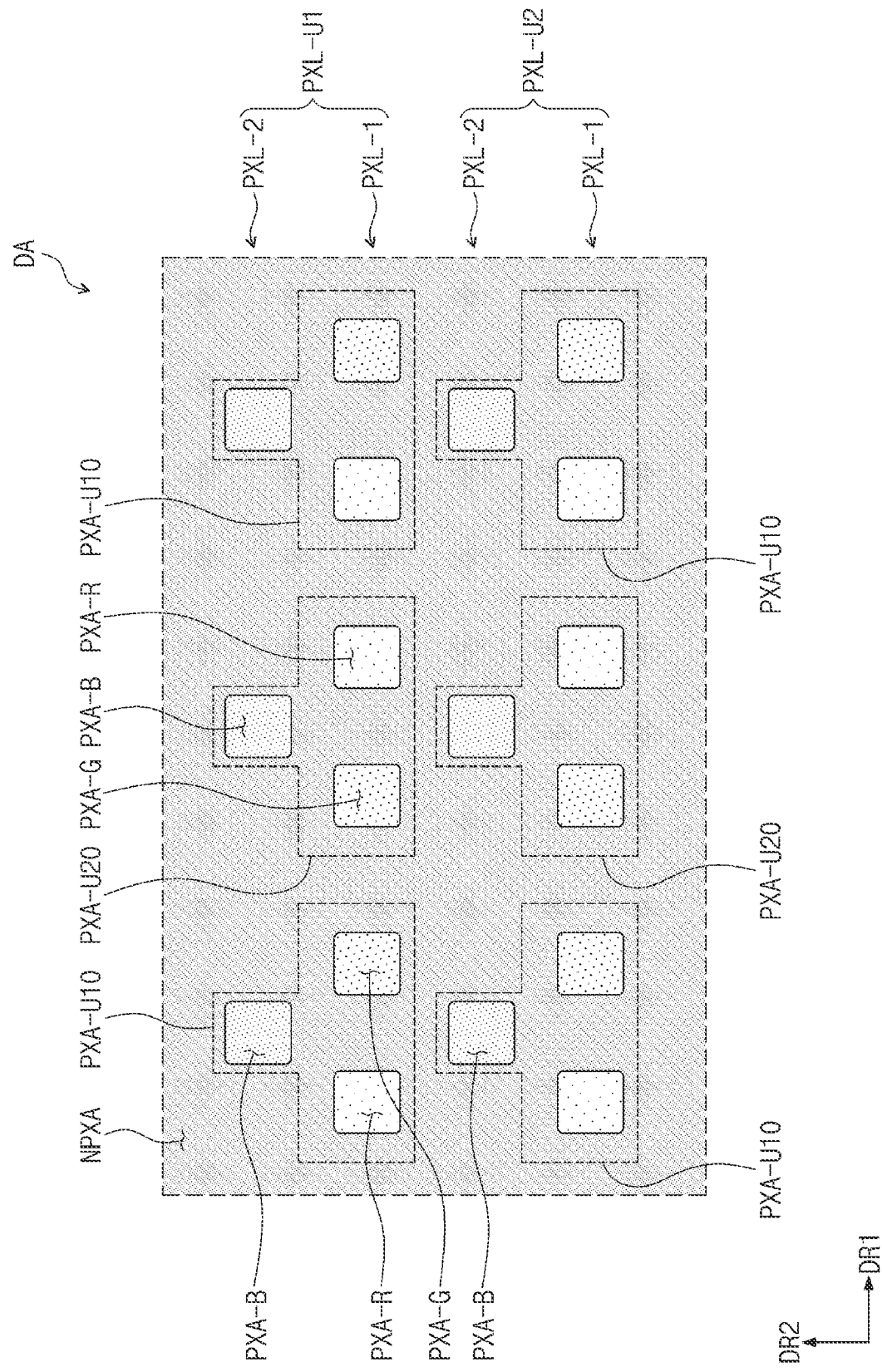
FIGS. 9a to 9c are plan views of a display area of the display panel according to some embodiments of the present invention.
Figure 9B:
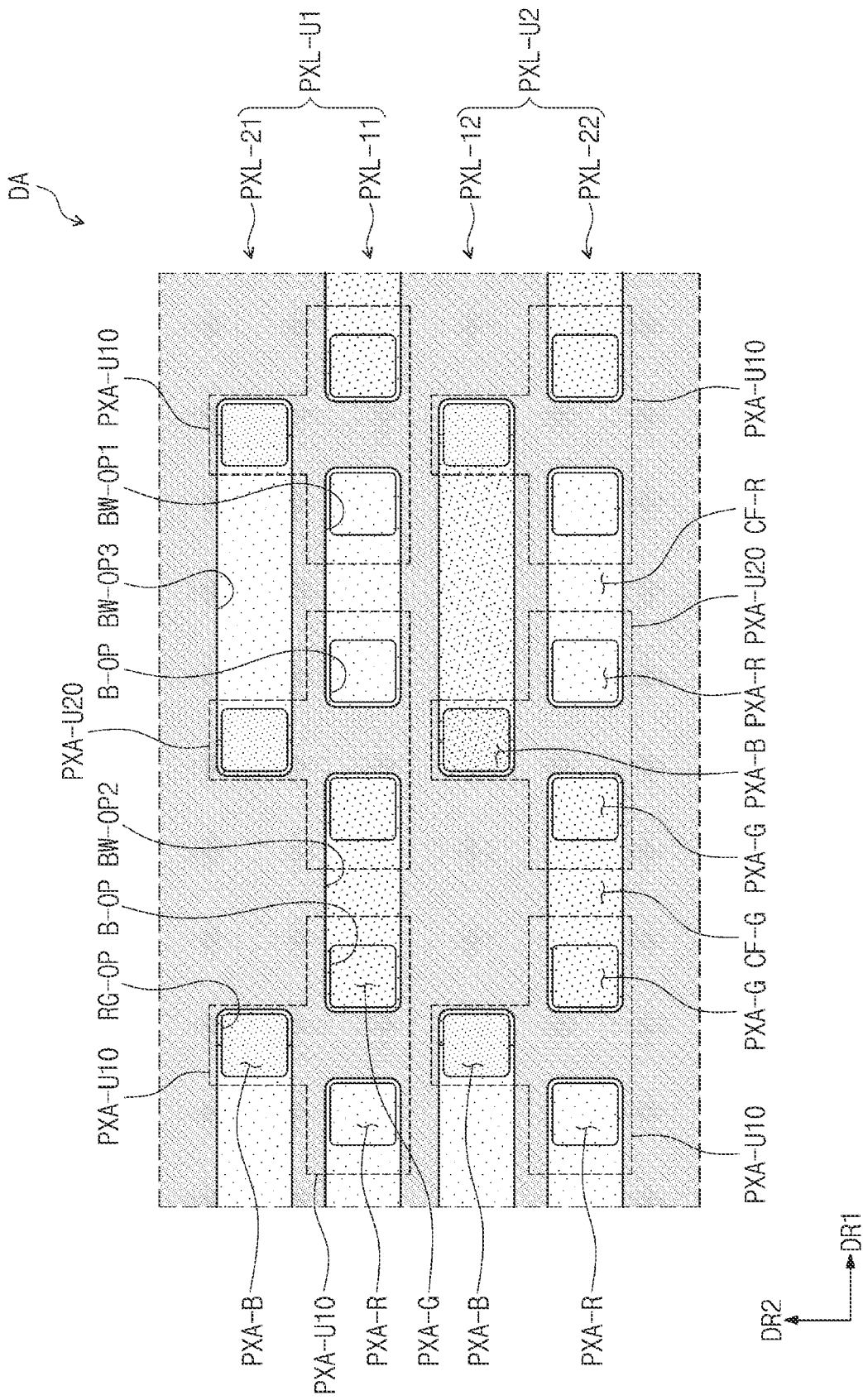
Figure 9C:
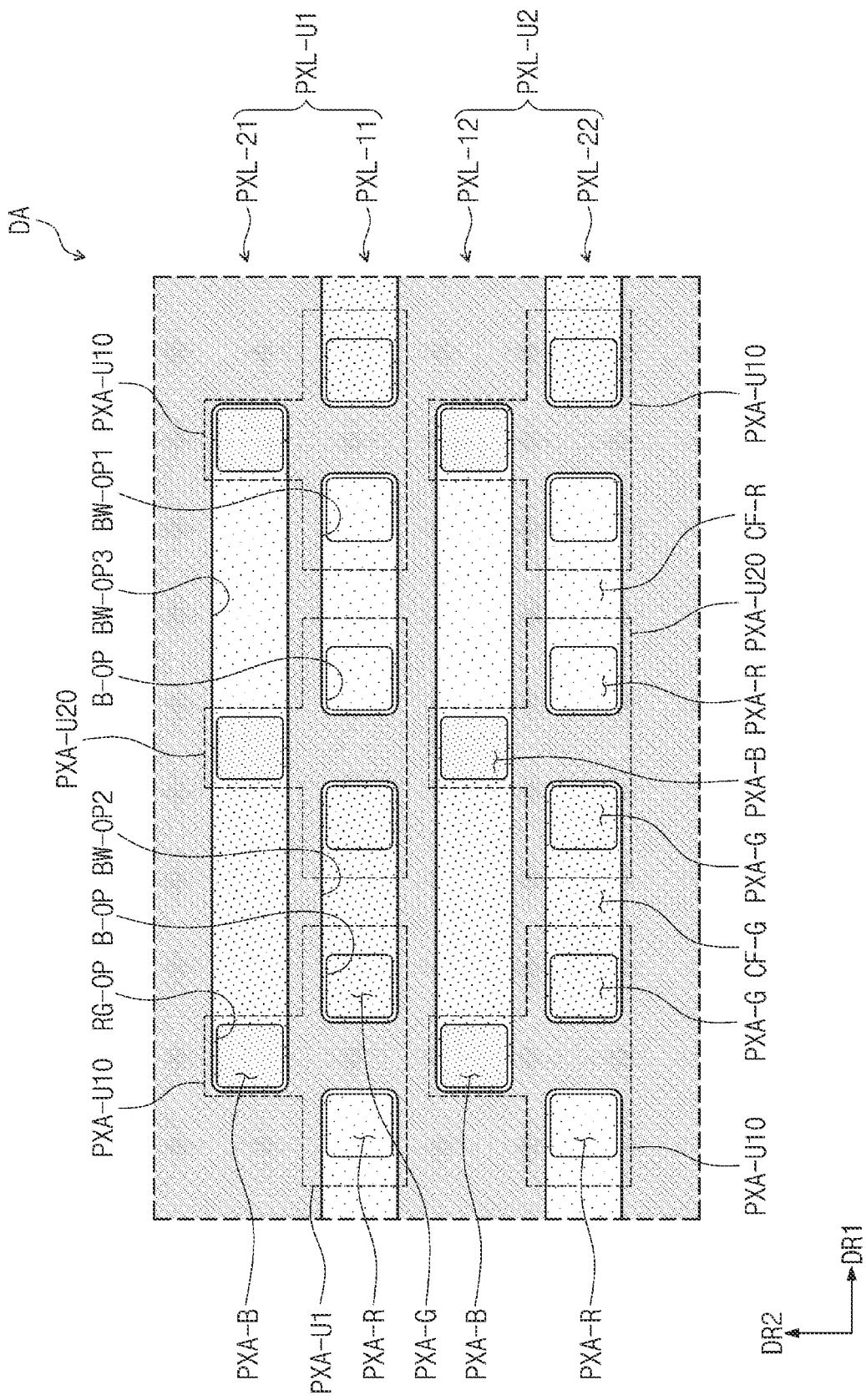

FIGS. 9a to 9c are plan views of a display area DA of the display panel according to some embodiments of the present invention. FIG. 9a corresponds to FIG. 3a, and FIGS. 9b and 9c correspond to FIG. 4e. Hereinafter, detailed descriptions of the same configuration as that described with reference to FIGS. 1 to 8c will be omitted.

Referring to FIG. 9a, a unit pixel row PXL-U includes first unit areas PXA-U10 and second unit areas PXA-U20, which are alternately arranged along the first direction DR1. A third pixel area PXA-B of each of the first unit areas PXA-U10 and the second unit areas PXA-U20 is located at one side (upper side in FIG. 9a) in the second direction DR2 when compared to a first pixel area PXA-R and a second pixel area PXA-G. An arrangement order of the first pixel area PXA-R and the second pixel area PXA-G of the first unit areas PXA-U10 in the first direction DR1 is different from that of the first pixel area PXA-R and the second pixel area PXA-G of the second unit area PXA-U20 in the first direction DR1.

Referring to FIGS. 9a and 9b, the first unit areas PXA-U10 of the first unit pixel row PXL-U1 and the second unit pixel row PXL-U2, which are continuous in the second direction DR2, are aligned. Also, the second unit area PXA-U20 of a first unit pixel row PXL-U1 and the second unit areas PXA-U20 of a second unit pixel row PXL-U2 are aligned. According to some embodiments, as shown in FIG. 9b, a first color filters CF-R and a second color filters CF-G are alternately arranged along the first direction DR1 as illustrated in FIG. 8b.

As illustrated in FIG. 9b, the first color filters CF-R overlap the first pixel area PXA-R of the first unit pixel row PXL-U1 and the first pixel areas PXA-R of the second unit pixel row PXL-U2, which are aligned in the second direction DR2, respectively. The second color filters CF-G overlap the second pixel area PXA-G of the unit pixel row PXL-U1 and the second pixel areas PXA-G of the second unit pixel row PXL-U2, which are aligned in the second direction DR2, respectively. The first color filters CF-R and the second color filters CF-G define a second opening RG-OP corresponding to the third pixel area PXA-B.

As illustrated in FIG. 9b, a first common opening BW-OP1, a second common opening BW-OP2, and a third common opening BW-OP3 are defined in a second division pattern BW. The first common opening BW-OP1 corresponds to the first pixel area PXA-R of the first unit area PXA-U10 and the first pixel area PXA-R of the second unit area PXA-U20, which are aligned to be adjacent to each other in the first direction DR1. The second common opening BW-OP2 corresponds to the second pixel area PXA-G of the first unit area PXA-U10 and the second pixel area PXA-G of the second unit area PXA-U20, which are aligned to be adjacent to each other in the first direction DR1. The third common opening BW-OP3 corresponds to the third pixel area PXA-B of the first unit area PXA-U10 and the third pixel area PXA-B of the second unit area PXA-U20, which are aligned to be adjacent to each other in the first direction DR1.

According to some embodiments, as described with reference to FIG. 4a, a first color control pattern CCF-R is located in the first common opening BW-OP1. A second color control pattern CCF-G may be located in the second common opening BW-OP2, and a third color control pattern CCF-B may be located in the third common opening BW-OP3.

As illustrated in FIG. 9c, the third common opening BW-OP3 may correspond to three or more third pixel areas PXA-B provided in one pixel row PXL-12 or PXL-21.

According to some embodiments, color filters CF-R and CF-G may be modified, like the color filters CF-R and CF-G illustrated in FIGS. 5a and 5b. In addition, in the display area DA described with reference to FIGS. 9a to 9c, the third division pattern BM described with reference to FIG. 5c may be further located. In addition, the color filters CF-R, CF-G, and CF-B described with reference to FIGS. 9a to 9c may be modified, like the color filters CF-R, CF-G, and CF-B described with reference to FIGS. 6a to 6e. Also, the display area DA described with reference to FIGS. 9a to 9c may be applied to a display panel including one base substrate BS1, like the display panel DP described with reference to FIG. 7.

Figure 10A:
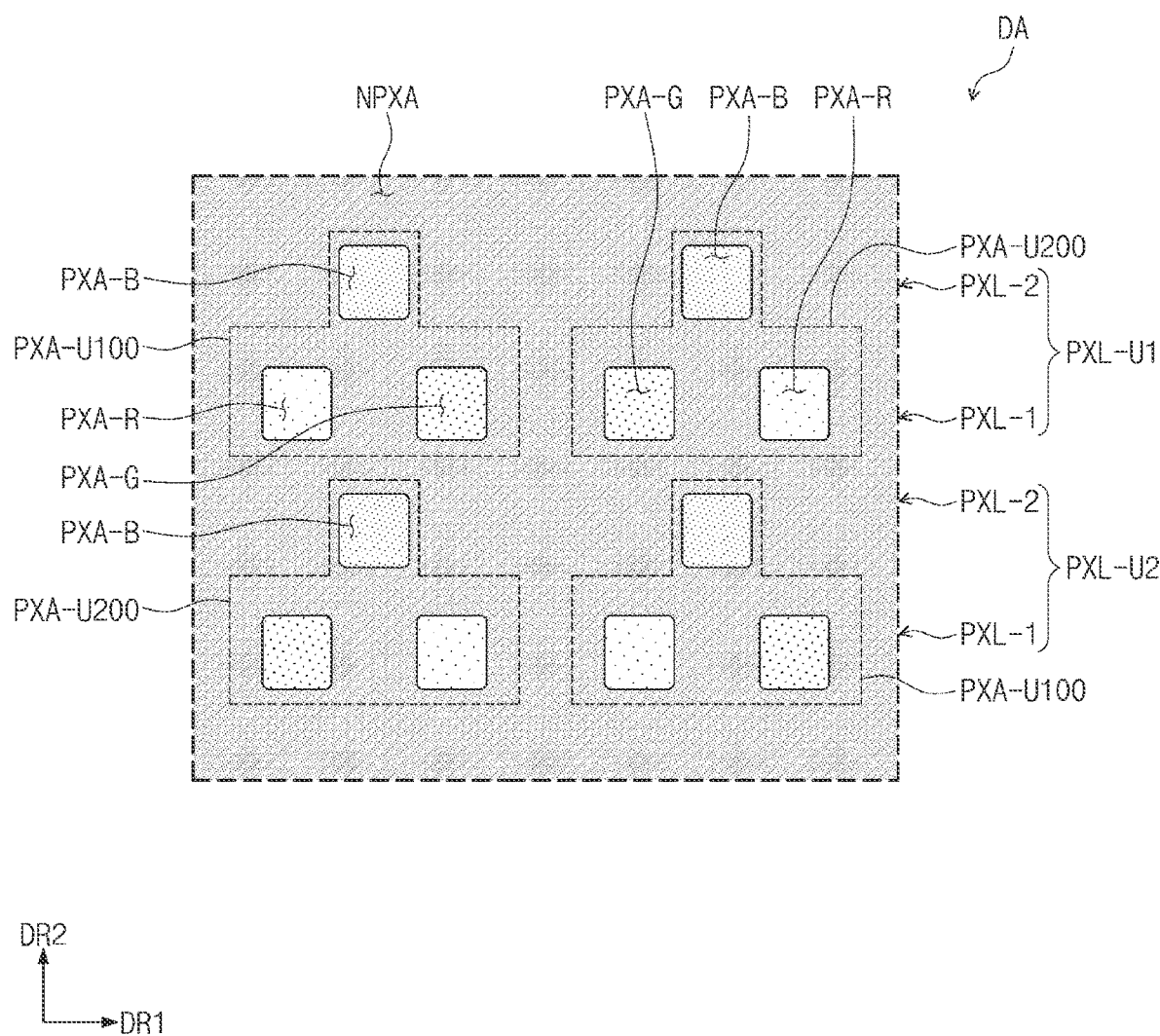
FIGS. 10a to 10c are plan views of a display area of the display panel according to some embodiments of the present invention.
Figure 10B:
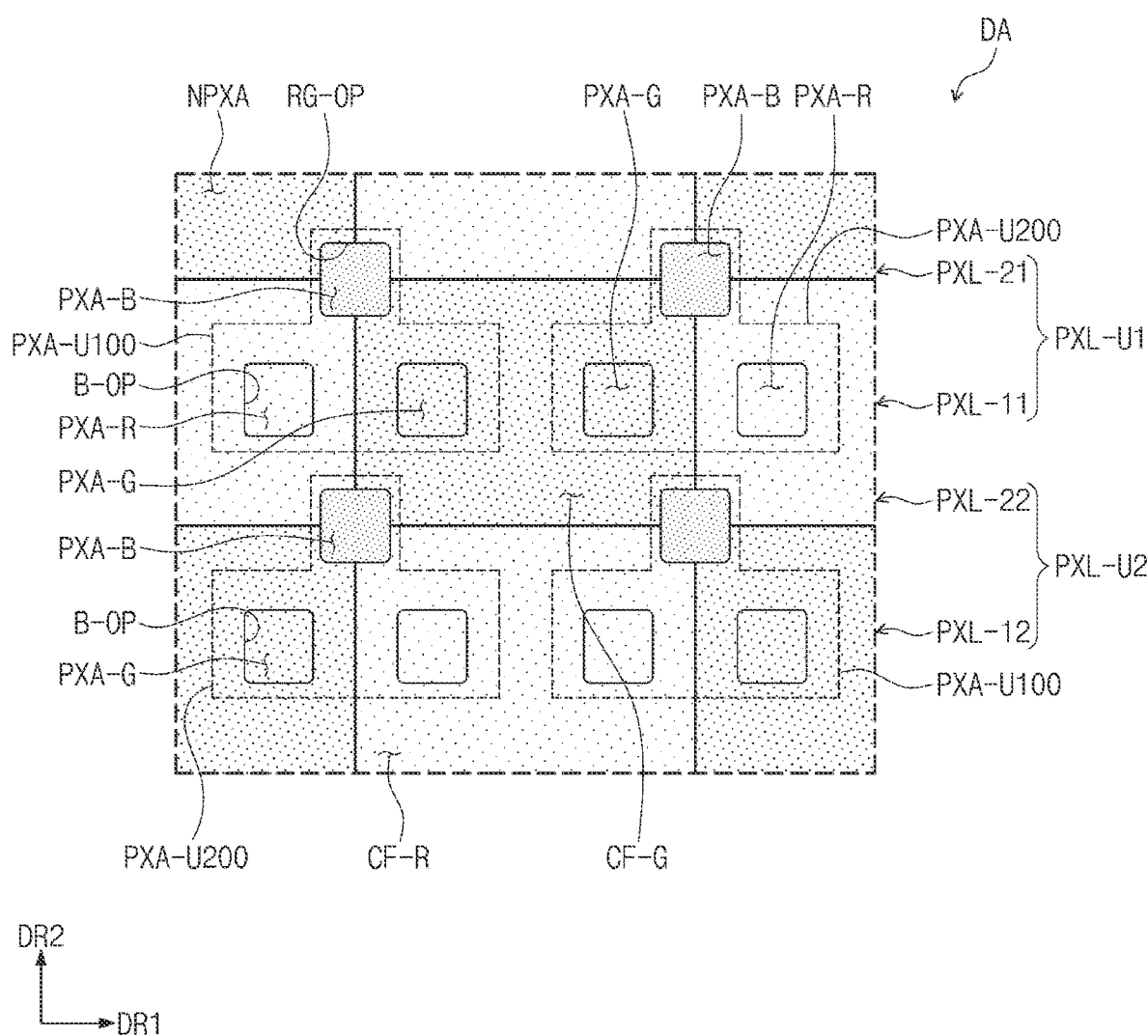
Figure 10C:
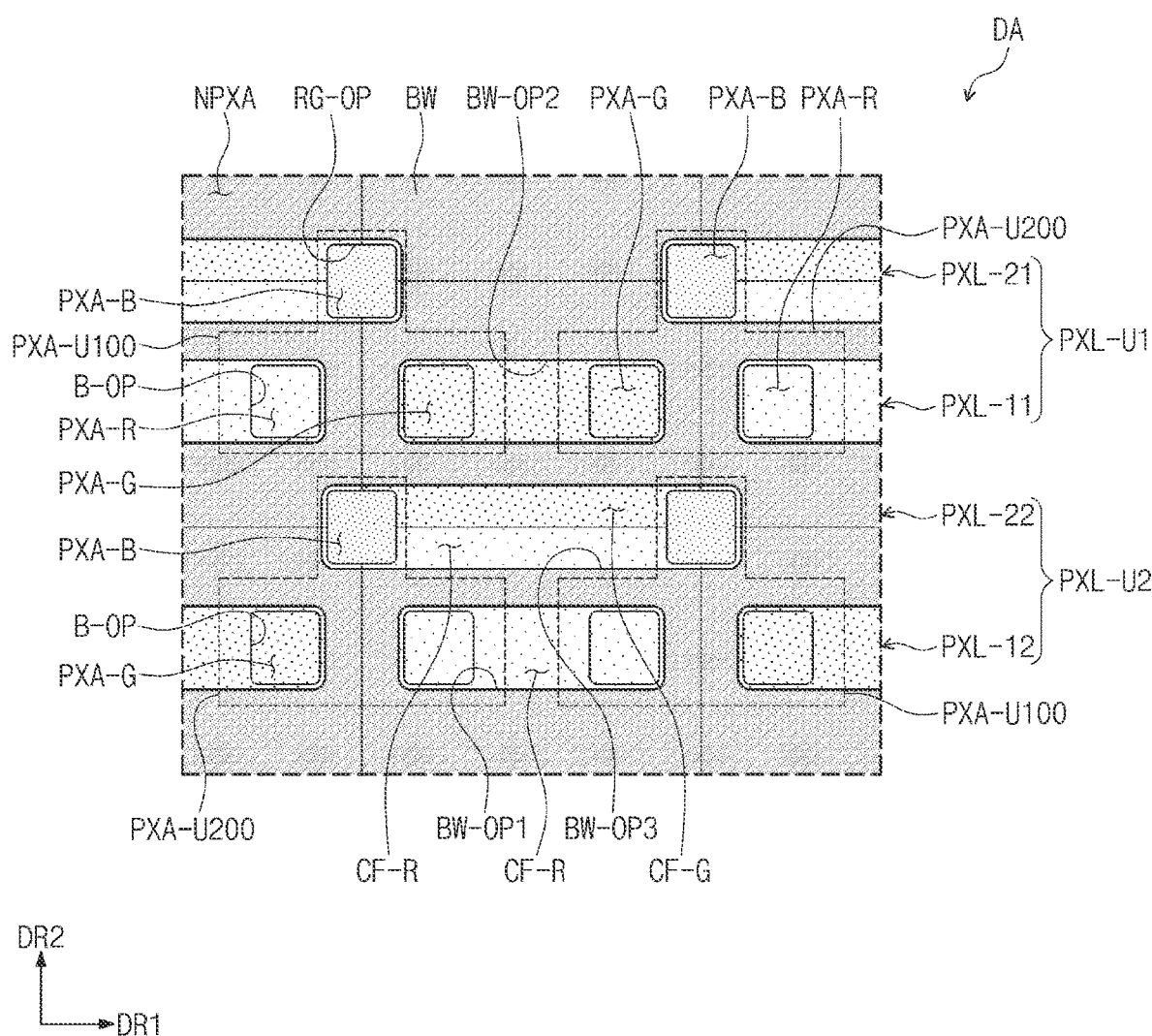

FIGS. 10a to 10c are plan views of a display area of the display panel according to some embodiments of the present invention. FIG. 10a corresponds to FIG. 3a, FIG. 10b corresponds to FIG. 4e, and FIG. 10c corresponds to FIG. 4f. Hereinafter, detailed descriptions of the same configuration as the that described with reference to FIGS. 1 to 9c will be omitted.

Referring to FIG. 10a, a unit pixel row PXL-U includes first unit areas PXA-U100 and second unit areas PXA-U200, which are alternately arranged along the first direction DR1. A third pixel area PXA-B of each of the first unit areas PXA-U100 and the second unit areas PXA-U200 is located above a first pixel area PXA-R and a second pixel area PXA-G in the second direction DR2. An arrangement order of the first pixel area PXA-R and the second pixel area PXA-G of the first unit areas PXA-U100 in the first direction DR1 is different from that of the first pixel area PXA-R and the second pixel area PXA-G of the second unit area PXA-U200 in the first direction DR1.

Referring to FIG. 10a, the first unit areas PXA-U100 of two continuous unit pixel rows PXL-U are not aligned in the second direction DR2. In other words, the first unit areas PXA-U100 of two continuous unit pixel rows PXL-U may be alternately located in the second direction DR2. The first unit area PXA-U100 and the second unit area PXA-U200 of two continuous unit pixel rows PXL-U are aligned in the second direction DR2.

As illustrated in FIG. 10b, the first color filters CF-R and the second color filters CF-G are arranged in the form of a grid. A second opening RG-OP corresponding to the third pixel area PXA-B may be defined by two first color filters CF-R and two second color filters CF-G.

The first color filter CF-R overlaps the first pixel area PXA-R of the first unit area PXA-U100 and the first pixel areas PXA-R of the second unit area PXA-U200, which are aligned to be adjacent to each other in the first direction DR1, respectively. The second color filter CF-G overlaps the second pixel area PXA-G of the first unit area PXA-U100 and the second pixel areas PXA-G of the second unit area PXA-U200, which are aligned to be adjacent to each other in the first direction DR1, respectively.

As illustrated in FIG. 10c, a first common opening BW-OP1, a second common opening BW-OP2, and a third common opening BW-OP3 are defined in a second division pattern BW. The first common opening BW-OP1 corresponds to the first pixel area PXA-R of the first unit area PXA-U100 and the first pixel area PXA-R of the second unit area PXA-U200, which are aligned to be adjacent to each other in the first direction DR1. The second common opening BW-OP2 corresponds to the second pixel area PXA-G of the first unit area PXA-U100 and the second pixel area PXA-G of the second unit area PXA-U200, which are aligned to be adjacent to each other in the first direction DR1. The third common opening BW-OP3 corresponds to the third pixel area PXA-B of the first unit area PXA-U100 and the third pixel area PXA-B of the second unit area PXA-U200, which are aligned to be adjacent to each other in the first direction DR1.

According to some embodiments, as described with reference to FIG. 4a, a first color control pattern CCF-R is located in the first common opening BW-OP1. A second color control pattern CCF-G may be located in the second common opening BW-OP2, and a third color control pattern CCF-B may be located in the third common opening BW-OP3.

According to some embodiments, as illustrated in FIG. 9c, the third common opening BW-OP3 may correspond to three or more third pixel areas PXA-B provided in one pixel row PXL-12 or PXL-21.

According to some embodiments, the color filters CF-R and CF-G may occupy a surface area greater than that of the second color filter CF-G, like the color filters CF-R and CF-G illustrated in FIGS. 5a and 5b. In addition, in the display area DA described with reference to FIGS. 10a to 10c, the third division pattern BM described with reference to FIG. 5c may be further located. In addition, the color filters CF-R, CF-G, and CF-B described with reference to FIGS. 10a to 10c may be modified, like the color filters CF-R, CF-G, and CF-B described with reference to FIGS. 6a to 6e. Also, the display area DA described with reference to FIGS. 10a to 10c may be applied to a display panel including one base substrate BS1, like the display panel DP described with reference to FIG. 7.

It will be apparent to those skilled in the art that various modifications and deviations can be made in the present invention. Thus, it is intended that the present invention covers the modifications and deviations of this invention provided they come within the scope of the appended claims and their equivalents.

Accordingly, the technical scope of the present invention should not be limited to the contents described in the detailed description of the specification, but should be determined by the appended claims, and their equivalents.

Because the present invention is capable of providing the display device, in which the occurrence of the crosstalk is prevented, and the reflectance of the external light is reduced, industrial applicability is recognized.

The invention claimed is:

1. A display panel comprising:
   a lower display substrate comprising light emitting elements configured to generate source light; and
   an upper display substrate comprising first and second pixel rows, each of which comprise first and second pixel areas, which are alternately arranged along a first direction, and a peripheral area adjacent to the first pixel areas and the second pixel areas, wherein the first pixel row and the second pixel row are arranged along a second direction crossing the first direction,
   wherein the upper display substrate comprises:
   a first division pattern in which a plurality of first openings corresponding to the first pixel areas and the second pixel areas are defined;
   a first color filter overlapping each of the first pixel area of the first pixel row and the first pixel area of the second pixel row, which are aligned in the second direction, among the first pixel areas of the first pixel row and the second pixel row;
   a second division pattern overlapping the peripheral area and in which a first common opening corresponding to and overlapping the first pixel area of the first pixel row and the first pixel area of the second pixel row, which are aligned in the second direction, is defined with the second division pattern defining outside edges of the first common opening; and
   a first color control pattern corresponding to the first common opening.

2. The display panel of claim 1, wherein, in a plan view, a portion of the first division pattern is between the first pixel area of the first pixel row and the first pixel area of the second pixel row, which are aligned in the second direction, and
   the first color control pattern overlaps the portion of the first division pattern.

3. The display panel of claim 1, wherein, in a plan view, the first pixel area of the first pixel row and the first pixel area of the second pixel row are inside the first common opening.

4. The display panel of claim 1, wherein a second common opening corresponding to the second pixel area of the first pixel row and the second pixel area of the second pixel row, which are aligned in the second direction, among the second pixel areas of the first pixel row and the second pixel row is further defined in the second division pattern, and
   the upper display substrate further comprises a second color control pattern corresponding to the second common opening and overlapping each of the second pixel area of the first pixel row and the second pixel area of the second pixel row, which are aligned in the second direction.

5. The display panel of claim 4, wherein the first color control pattern and the second color control pattern comprise quantum dots different from each other.

6. The display panel of claim 4, further comprising a second color filter overlapping each of the second pixel area of the first pixel row and the second pixel area of the second pixel row, which are aligned in the second direction.

7. The display panel of claim 6, wherein a portion of each of the first color filter and the second color filter overlaps the peripheral area.

8. The display panel of claim 6, wherein the upper display substrate further comprises a third pixel row and a fourth pixel row, which comprise third pixel areas arranged along the first direction, wherein the third pixel row and the fourth pixel row are spaced apart from each other in the second direction, and
the first pixel row and the second pixel row are between the third pixel row and the fourth pixel row in the second direction.

9. The display panel of claim 8, wherein a second opening corresponding to each of the third pixel areas is defined by combining a portion of the first color filter and a portion of the second color filter.

10. The display panel of claim 9, wherein the first pixel areas are configured to provide red light, the second pixel areas are configured to provide green light, and the third pixel areas are configured to provide blue light, and
the first color filter occupies a surface area greater than that of the second color filter on a peripheral area of the second opening.

11. The display panel of claim 8, wherein a combination of the second pixel row and the fourth pixel row is defined as a unit pixel row, wherein the unit pixel row comprises a plurality of unit areas arranged along the first direction,
each of the plurality of unit areas comprises one first pixel area and one second pixel area, which are adjacent to each other, among the first pixel areas and the second pixel areas of the second pixel row, and one third pixel area among the third pixel areas of the fourth pixel row, and
the one third pixel area is between the one first pixel area and the one second pixel area in the first direction.

12. The display panel of claim 8, wherein the first division pattern comprises a third color filter having a color that is different from that of each of the first color filter and the second color filter, wherein the third color filter overlaps the third pixel areas.

13. The display panel of claim 12, wherein, in a partial area of the peripheral area adjacent to the first pixel areas, the third color filter and the first color filter overlap each other.

14. The display panel of claim 13, wherein, in the partial area of the peripheral area adjacent to the first pixel areas, the second color filter overlaps the first color filter and the third color filter.

15. The display panel of claim 1, wherein second openings corresponding to the second pixel areas are defined in the first color filter.

16. A display panel, comprising:
first and second pixel rows, each of which comprise first and second pixel areas, which are alternately arranged along a first direction, and a peripheral area adjacent to the first pixel areas and the second pixel areas, wherein the first pixel row and the second pixel row are arranged along a second direction crossing the first direction;
light emitting elements overlapping the first pixel areas and the second pixel areas and configured to generate source light;
a first color filter overlapping the first pixel area of the first pixel row and the first pixel area of the second pixel row, which are aligned in the second direction, among the first pixel areas;
a second color filter overlapping the second pixel area of the first pixel row and the second pixel area of the second pixel row, which are aligned along the second direction, among the second pixel areas;
a third color filter, in which a plurality of first opening corresponding to the first pixel areas and the second pixel areas are defined;
a partition wall overlapping the peripheral area and in which a first common opening corresponding to and overlapping the first pixel area of the first pixel row and the first pixel area of the second pixel row, which are aligned along the second direction, is defined with the partition wall defining outside edges of the first common opening; and
a first quantum dot layer corresponding to the first common opening and overlapping the first pixel area of the first pixel row and the first pixel area of the second pixel row, which are aligned along the second direction.

17. The display panel of claim 16, wherein a second common opening corresponding to the second pixel area of the first pixel row and the second pixel area of the second pixel row, which are aligned along the second direction, is further defined in the partition wall, and
the display panel further comprises a second quantum dot layer corresponding to the second common opening and overlapping the second pixel area of the first pixel row and the second pixel area of the second pixel row, which are aligned along the second direction.

18. The display panel of claim 16, wherein a plurality of second openings corresponding to the second pixel areas of the first pixel row and the second pixel areas of the second pixel row are defined in the first color filter, and
a plurality of third openings corresponding to the first pixel areas of the first pixel row and the second pixel row are defined in the second color filter.

19. The display panel of claim 16, wherein, in the first pixel area of the first pixel row and the first pixel area of the second pixel row, which are aligned in the second direction, the first color filter overlaps the first quantum dot layer, and in the peripheral area, the third color filter overlaps the first color filter.

20. A method for fabricating a display substrate, the method comprising:
providing a preliminary display substrate comprising first and second pixel rows, each of which comprises first pixel areas and second pixel areas, which are alternately arranged along a first direction, and a peripheral area adjacent to the first pixel areas and the second pixel areas, wherein the first pixel row and the second pixel row are arranged along a second direction crossing the first direction;
forming a partition wall, in which a common opening corresponding to and overlapping the first pixel area of the first pixel row and the first pixel area of the second pixel row, which are arranged in one pixel row on the preliminary display substrate is defined with the partition wall defining outside edges of the first common opening;
providing a quantum dot solution into the common opening; and
curing the quantum dot solution.

21. A display panel comprising:
a lower display substrate comprising light emitting elements configured to generate a source light; and
an upper display substrate comprising a first unit pixel row and a second unit pixel row, each of which comprise a plurality of unit areas arranged along a first direction and are arranged along a second direction crossing the first direction,
wherein each of the plurality of unit areas comprises a first pixel area, a second pixel area, a third pixel area, and a peripheral area adjacent to the first pixel area, the second pixel area, and the third pixel area, and
the upper display substrate comprises:
a first division pattern in which a plurality of first openings corresponding to the first pixel area and the second pixel area of the first unit pixel row and the second unit pixel row are defined;
a first color filter overlapping each of the first pixel area of the first unit pixel row and the first pixel area of the second unit pixel row, which are aligned along the second direction;
a second division pattern overlapping the peripheral area and in which a first common opening corresponding to and overlapping the first pixel area of the first unit pixel row and the first pixel area of the second unit pixel row, which are aligned along the second direction, is defined with the second division pattern defining outside edges of the first common opening; and
a first color control pattern corresponding to the first common opening.

22. The display panel of claim 21, wherein the first pixel area, the second pixel area, and the third pixel area of each of the plurality of unit areas of the first unit pixel row have a first arrangement, and
the first pixel area, the second pixel area, and the third pixel area of each of the plurality of unit areas of the second unit pixel row have a second arrangement different from the first arrangement.

23. The display panel of claim 21, wherein the plurality of unit areas comprise a first unit area having a first arrangement of the first pixel area, the second pixel area, and the third pixel area and a second unit area having a second arrangement, which is different from the first arrangement, of the first pixel area, the second pixel area, and the third pixel area, and
wherein the first unit area of the first unit pixel row and the second unit area of the second unit pixel row are aligned in the second direction.

24. The display panel of claim 23, wherein a second common opening corresponding to the second pixel area of the first unit area of the first unit pixel row and the second pixel area of the second unit area of the second unit pixel row, which are aligned in the second direction, is defined in the second division pattern, and
the upper display substrate further comprises a second color filter, which overlaps each of the second pixel area of the first unit area of the first unit pixel row and the second pixel area of the second unit area of the second unit pixel row, which are aligned along the second direction, and a second color control pattern corresponding to the second common opening.

25. The display panel of claim 24, wherein the source light is blue light, the first color control pattern converts the blue light into red light, and the second color control pattern converts the blue light into green light.

26. The display panel of claim 24, wherein the first color filter and the second color filter are arranged along the first direction.

27. The display panel of claim 24, wherein the second unit area of the first unit pixel row and the first unit area of the second unit pixel row are aligned along the second direction, and
the upper display substrate further comprises a third color filter overlapping each of the third pixel area of the second unit area of the first unit pixel row and the third pixel area of the first unit area of the second unit pixel row, which are aligned in the second direction.

28. The display panel of claim 27, wherein a third common opening corresponding to the third pixel area of the second unit area of the first unit pixel row and the third pixel area of the first unit area of the second unit pixel row, which are aligned along the second direction is defined in the second division pattern,
the upper display substrate further comprises a third color control pattern corresponding to the third common opening, and
the source light is blue light, and the third color control pattern scatters incident blue light.

29. A display panel comprising:
a lower display substrate comprising light emitting elements configured to generate source light; and
an upper display substrate comprising a first unit pixel row and a second unit pixel row, each of which comprise a plurality of unit areas arranged along a first direction and are arranged along a second direction crossing the first direction,
wherein each of the plurality of unit areas comprises a first pixel area, a second pixel area, a third pixel area, and a peripheral area adjacent to the first pixel area, the second pixel area, and the third pixel area,
the plurality of unit areas comprise a first unit area having a first arrangement of the first pixel area, the second pixel area, and the third pixel area and a second unit area having a second arrangement, which is different from the first arrangement, of the first pixel area, the second pixel area, and the third pixel area, and
the upper display substrate comprises:
a first division pattern in which a plurality of first openings corresponding to the first pixel area and the second pixel area of the first unit pixel row and the second unit pixel row are defined;
a first color filter overlapping each of the first pixel area of the first unit area and the first pixel area of the second unit area of the first unit pixel row, which are aligned along the first direction;
a second division pattern which overlaps the peripheral area and in which a first common opening corresponding to the first pixel area of the first unit area and the first pixel area of the second unit area of the first unit pixel row, which are aligned along the first direction, is defined; and
a first color control pattern corresponding to the first common opening.

30. The display panel of claim 29, wherein the first unit area of the first unit pixel row and the first unit area of the second unit pixel row are aligned along the second direction, and
the second unit area of the first unit pixel row and the second unit area of the second unit pixel row are aligned along the second direction.

31. The display panel of claim 29, wherein the first unit area of the first unit pixel row and the second unit area of the second unit pixel row are aligned in the second direction, and the second unit area of the first unit pixel row and the first unit area of the second unit pixel row are aligned in the second direction.

32. The display panel of claim 29, wherein the upper display substrate further comprises:

a second color filter overlapping each of the second pixel area of the first unit area and the second pixel area of the second unit area of the second unit pixel row, which are adjacent to each other in the first direction; and a second color control pattern overlapping the second color filter, and a second common opening corresponding to the second pixel area of the first unit area and the second pixel area of the second unit area of the second unit pixel row and accommodating the second color control pattern is defined in the second division pattern.

33. The display panel of claim 29, wherein the upper display substrate further comprises:

a third color filter overlapping each of the third pixel area of the first unit area and the third pixel area of the second unit area of the first unit pixel row, which are adjacent to each other in the first direction; and a third color control pattern overlapping the third color filter, and a third common opening corresponding to the third pixel area of the first unit area and the third pixel area of the second unit area of the first unit pixel row, which are adjacent to each other in the first direction, and configured to accommodate the third color control pattern is defined in the second division pattern.

* * * * *